(12) United States Patent
Chiu et al.

(10) Patent No.: US 10,163,650 B2
(45) Date of Patent: Dec. 25, 2018

(54) SYSTEM AND METHOD FOR SELECTIVE NITRIDE ETCH

(71) Applicant: Taiwan Semiconductor Manufacturing Company, Ltd., Hsin-Chu (TW)

(72) Inventors: Yi-Wei Chiu, Kaohsiung (TW); Meng-Chuan Wu, Tainan (TW); Tzu-Chan Weng, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/355,940

(22) Filed: Nov. 18, 2016

(65) Prior Publication Data

US 2018/0144949 A1    May 24, 2018

(51) Int. Cl.

| | |
|---|---|
| *H01L 21/311* | (2006.01) |
| *H01J 37/32* | (2006.01) |
| *H01L 21/306* | (2006.01) |
| *H01L 21/3065* | (2006.01) |
| *H01L 21/3213* | (2006.01) |
| *H01L 21/67* | (2006.01) |
| *H01L 29/66* | (2006.01) |

(52) U.S. Cl.
CPC .... *H01L 21/31116* (2013.01); *H01J 37/3244* (2013.01); *H01J 37/32357* (2013.01); *H01J 37/32422* (2013.01); *H01L 21/3065* (2013.01); *H01L 21/30604* (2013.01); *H01L 21/31138* (2013.01); *H01L 21/32135* (2013.01); *H01L 21/32136* (2013.01); *H01L 21/32137* (2013.01); *H01L 21/67069* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,187,486 B1 | 5/2012 | Liu et al. | |
| 9,023,734 B2 | 5/2015 | Chen et al. | |
| 2015/0200271 A1* | 7/2015 | Lee | H01L 29/66795 257/401 |
| 2015/0371865 A1* | 12/2015 | Chen | H01L 21/31116 438/715 |

* cited by examiner

*Primary Examiner* — Jiong-Ping Lu

(74) *Attorney, Agent, or Firm* — Slater Matsil, LLP

(57) ABSTRACT

A representative method for selective radical-component etching of exposed nitride-containing material comprises the steps of: disposing a substrate in an etch processing region; producing a plasma in a plasma region; flowing a radical component of the plasma into the etch processing region while substantially excluding charged ions of the plasma from entering the etch processing region; flowing an unexcited gas into the etch processing region; and etching an exposed nitride-containing material with reaction products of the radical component of the plasma and the unexcited gas. Etch selectivity for nitride-containing material may be more than about 10 times that of oxide-containing material. In a representative aspect, etching proceeds without producing, or otherwise substantially reducing, residue on the surface of the substrate.

20 Claims, 32 Drawing Sheets

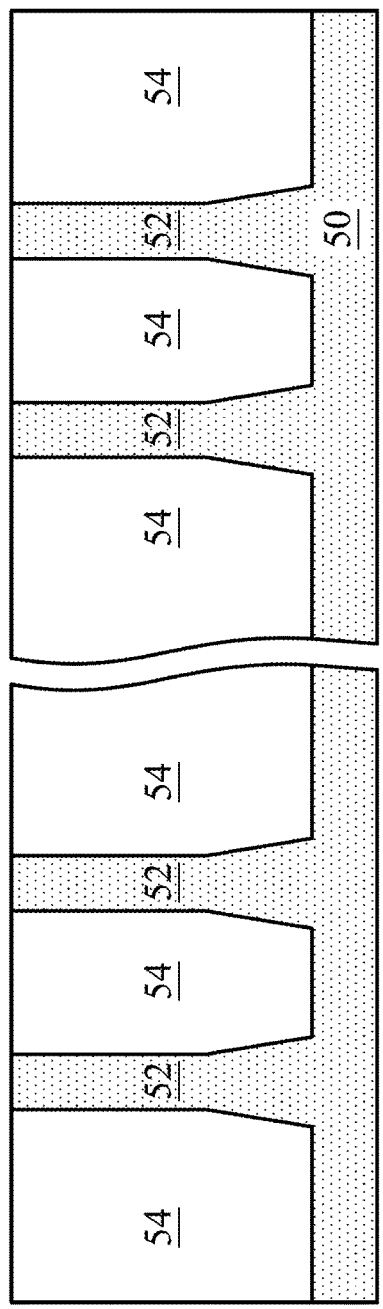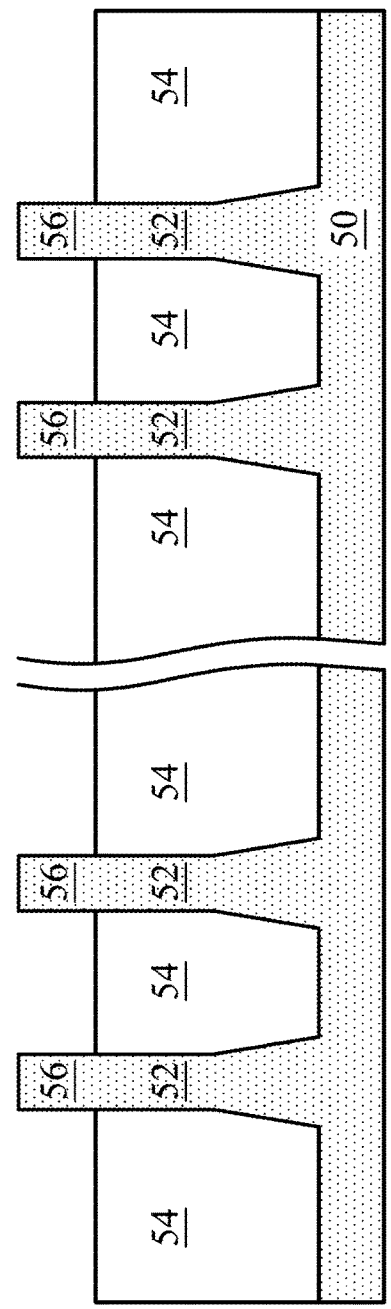

SYSTEM AND METHOD FOR SELECTIVE NITRIDE ETCH

BACKGROUND

Semiconductor processing often involves etching of wafers or substrates. A substrate surface may include both an exposed nitride layer and an exposed oxide layer in different regions of a wafer. A nitride-containing film may line a bottom surface and sidewalls of a semiconductor device feature, such as a recess. An oxide film may be deposited on portions of the nitride film. A device feature may have a high aspect ratio (i.e., where a horizontal opening is relatively small compared to the depth of the device feature) or a low aspect ratio (i.e., where a horizontal opening is relatively large compared to the depth of the feature). When more than one film is present on the surface of a substrate, non-selective etching of one film may involve etching another; however, etching of a particular film may or may not be desirable in some circumstances. Controlling relative etch rates of one material, as compared to another material, permits selective etching of one film in some circumstances, and etching of all exposed film surfaces in other circumstances.

Fabrication of a semiconductor device may involve hundreds of steps, many of which correspond to etching processes. In some settings, it may be desirable to have a very low or a very high etch rate. A very low etch rate, however, may not be commercially desirable to the extent that manufacturing throughput may be reduced. Consequently, semiconductor processes employ etching selectivities and absolute etch rates that are selected to maximize manufacturing throughput while minimize undesired etching.

BRIEF DESCRIPTION OF THE DRAWINGS

Aspects of the present disclosure may be best understood from the following detailed description when read with the accompanying Figures. It is to be noted that the drawings illustrate representative embodiments of the invention, and are therefore not to be considered limiting of the scope of the disclosure, which may admit to other correspondingly effective embodiments. In addition, although the Figures may depict embodiments where one or more components represent different devices or locations, the same may be combined into a single device or location. Additionally, a single component may be comprised of a combination of components. Various features are not drawn to scale. For example, dimensions of various features may be arbitrarily increased or reduced for clarity of illustration or description.

FIGS. 14-18, 19a-19c, 20a-20c, 21a-21c, 22a-22c, 23a-23c, 24a-24c, 25a-25c, and 26a-26c representatively illustrate cross-sectional views of intermediate stages in the manufacture of FinFETs, in accordance with some embodiments.

DETAILED DESCRIPTION

Figure 1:
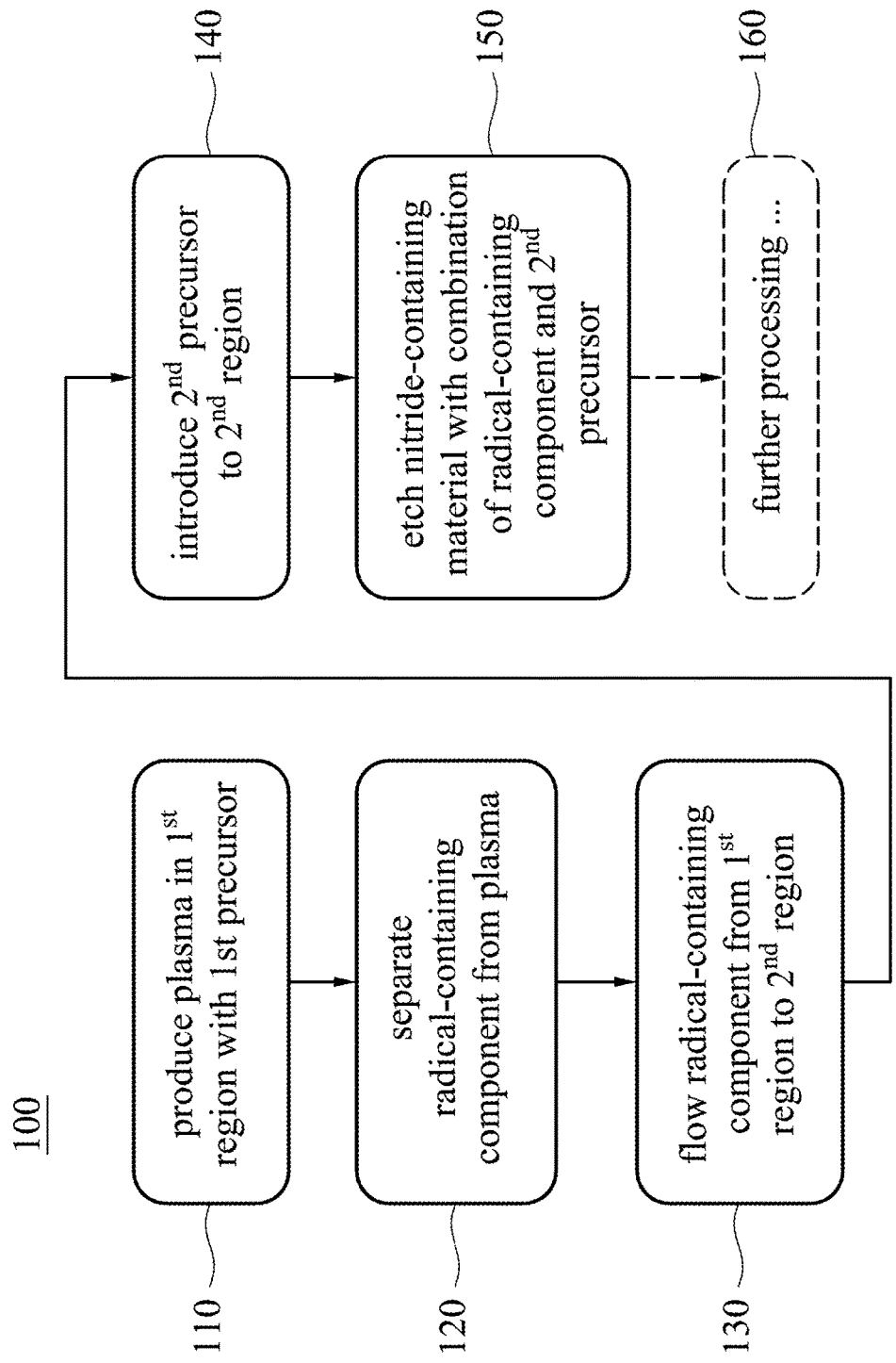
FIG. 1 representatively illustrates a method of etching a nitride-containing material, in accordance with an embodiment.

The following description provides many different embodiments, or examples, for implementing different features and aspects of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between or among various embodiments and/or configurations discussed.

Aspects of representatively disclosed embodiments are direct to etching of nitride-containing materials from substrates using a selective radical etch process. In a representative aspect, the nitride-selective radical etch may be isotropic. While representative methods find particular application in the processing of fin field-effect transistor (FinFET) semiconductor devices, they may also be employed in other applications, such as removal of nitride-containing materials from other workpieces (e.g., flat panel display devices, or the like.)

FIG. 1 representatively illustrates a method 100 of selectively etching an exposed nitride (e.g., silicon nitride) material, for example, on patterned device structures. Method 100 begins with step 110 in which a plasma is produced in a first region with one or more first precursors. In step 120, one or more radical components are separated from the plasma. In step 130, the one or more radical components are flowed from the first region (e.g., a plasma region) to a second region (e.g., a substrate processing region). In step 140, one or more second precursors are introduced to the second region. A substrate or workpiece comprising a nitride material is disposed in the second region. In step 150, nitride material is etched with a combination of the one or more radical components separated from the plasma and the one or more second precursors. In step 160, the substrate or workpiece may be optionally subjected to one or more further processing steps.

Figure 2:
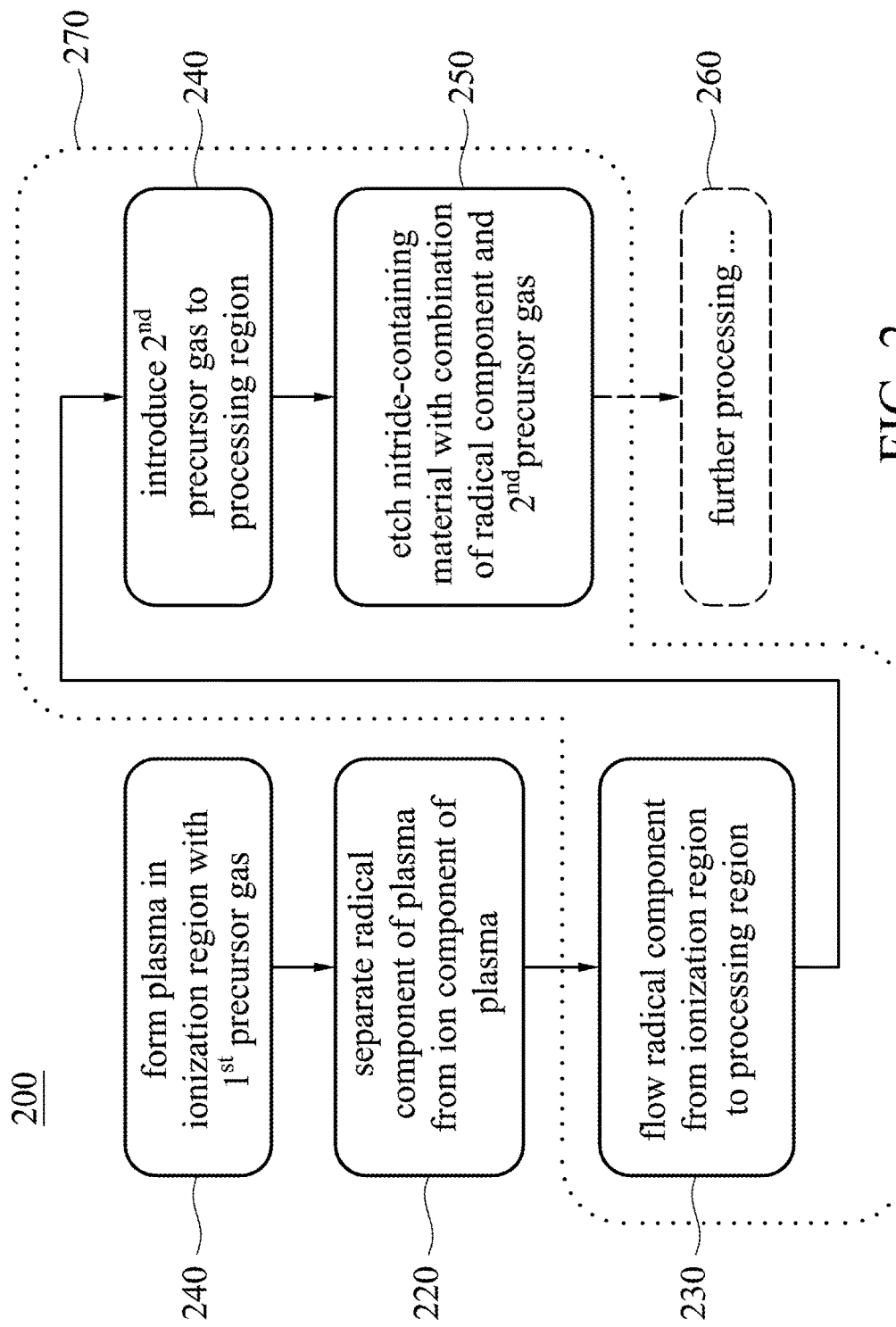
FIG. 2 representatively illustrates a method of etching a nitride-containing material, in accordance with another embodiment.

FIG. 2 representatively illustrates a method 200 of selectively etching a nitride-containing material (e.g., SiN). Method 200 begins with step 210 in which a plasma is formed in a plasma ionization region with a first precursor gas. The first precursor gas may comprise one or more first gaseous components. In step 220, radical components of the plasma are separated from ion components of the plasma. In step 230, radical components of the plasma are flowed from the plasma ionization region to a processing region. In step 240, a second precursor gas is introduced to the processing region. The second precursor gas may comprise one or more second gaseous components. The one or more second gaseous components may be the same as or different than the first gaseous components. A substrate or workpiece having a nitride-containing material is disposed in the processing region. In step 250, nitride material is etched with a combination of reaction products of radicals separated from the plasma and the second precursor gas. In a representative embodiment, step 250 may be referred to as a radical-component etching process. In another representative embodiment, step 270 (comprising any sequence of steps 230, 240, and 250 may be referred to as a radical-component etching process). That is to say that in some embodiments, etching 270 may proceed with introduction of the second precursor gas before or substantially concurrent with introduction of the radical component separated from the plasma. In step 260, the substrate or workpiece may be optionally submitted for one or more further processing steps to continue manufacture of a device.

Figure 3:
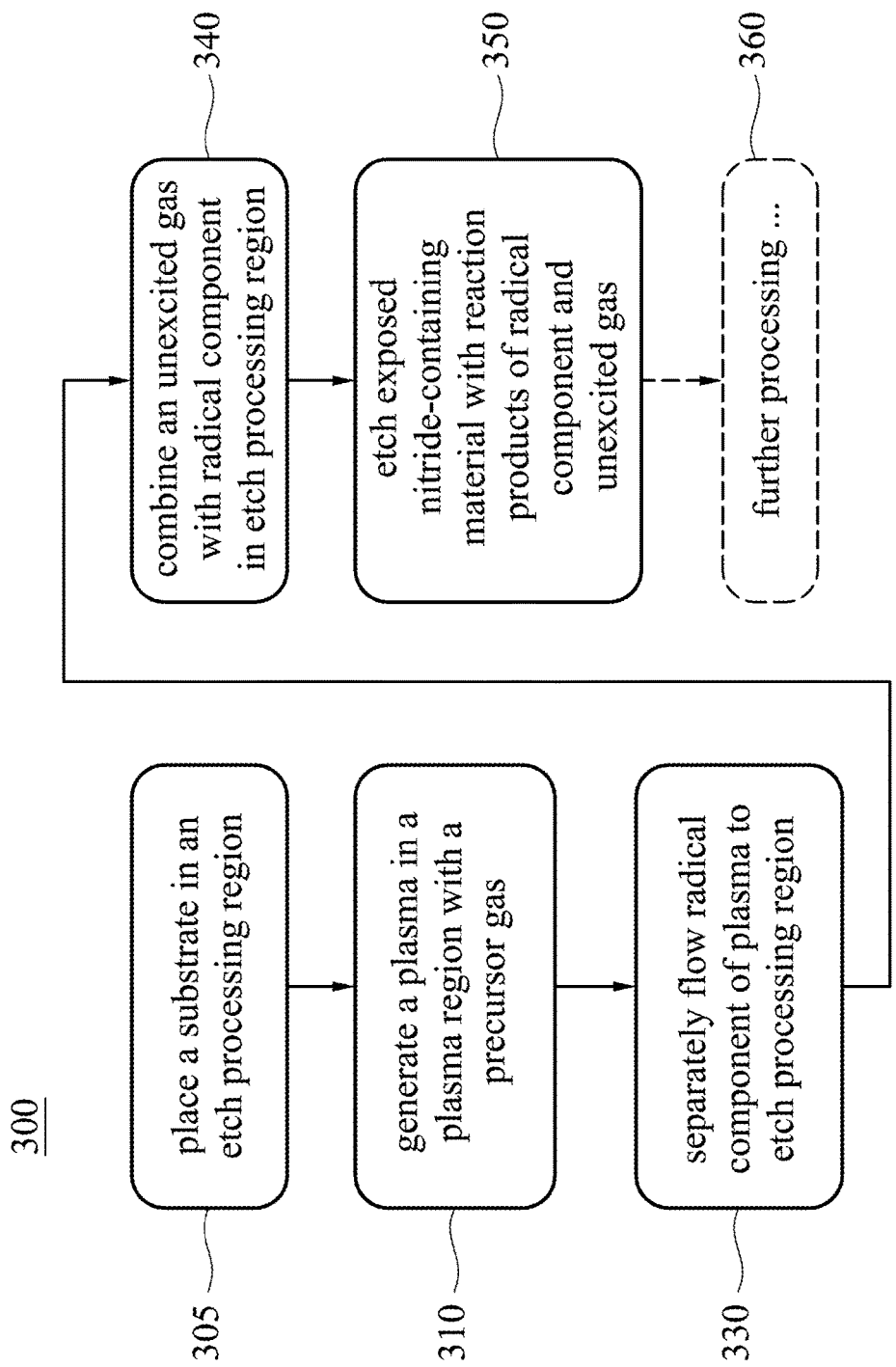
FIG. 3 representatively illustrates a method of etching a nitride-containing material, in accordance with yet another embodiment.

FIG. 3 representatively illustrates a method 300 of selectively etching an exposed nitride material (e.g., silicon nitride). Method 300 begins with step 305 in which a substrate (or workpiece) is placed in an etch processing region. In step 310, a plasma is generated in a plasma region with a precursor gas. The precursor gas may comprise one or more first gaseous components. In step 330, a radical component of the plasma is separately flowed from the plasma region to the etch processing region. In representative embodiments, all or a substantial portion of ionic components of the plasma are retained in the plasma region and are not introduced to the etch processing region. In step 340, an unexcited gas is introduced to (and chemically combined with) the radical component of the plasma in the etch processing region. The unexcited gas may comprise one or more gaseous components. Although method 300 representatively illustrates introduction of the radical component of the plasma to the etch processing region before introduction of the unexcited gas, other sequences of introduction are possible. For example, in one embodiment, the unexcited gas may be introduced to the etch processing region before the radical component of the plasma. In another embodiment, the unexcited gas may be introduced substantially simultaneously with introduction of the radical component of the plasma. In step 350, exposed nitride-containing material is etched with products formed by chemical reaction of the radical component separated from the plasma with the unexcited gas in a surface adsorption/desorption process. In step 360, the substrate (or other workpiece) may be optionally further processed to complete manufacture of a finished device.

Figure 4:
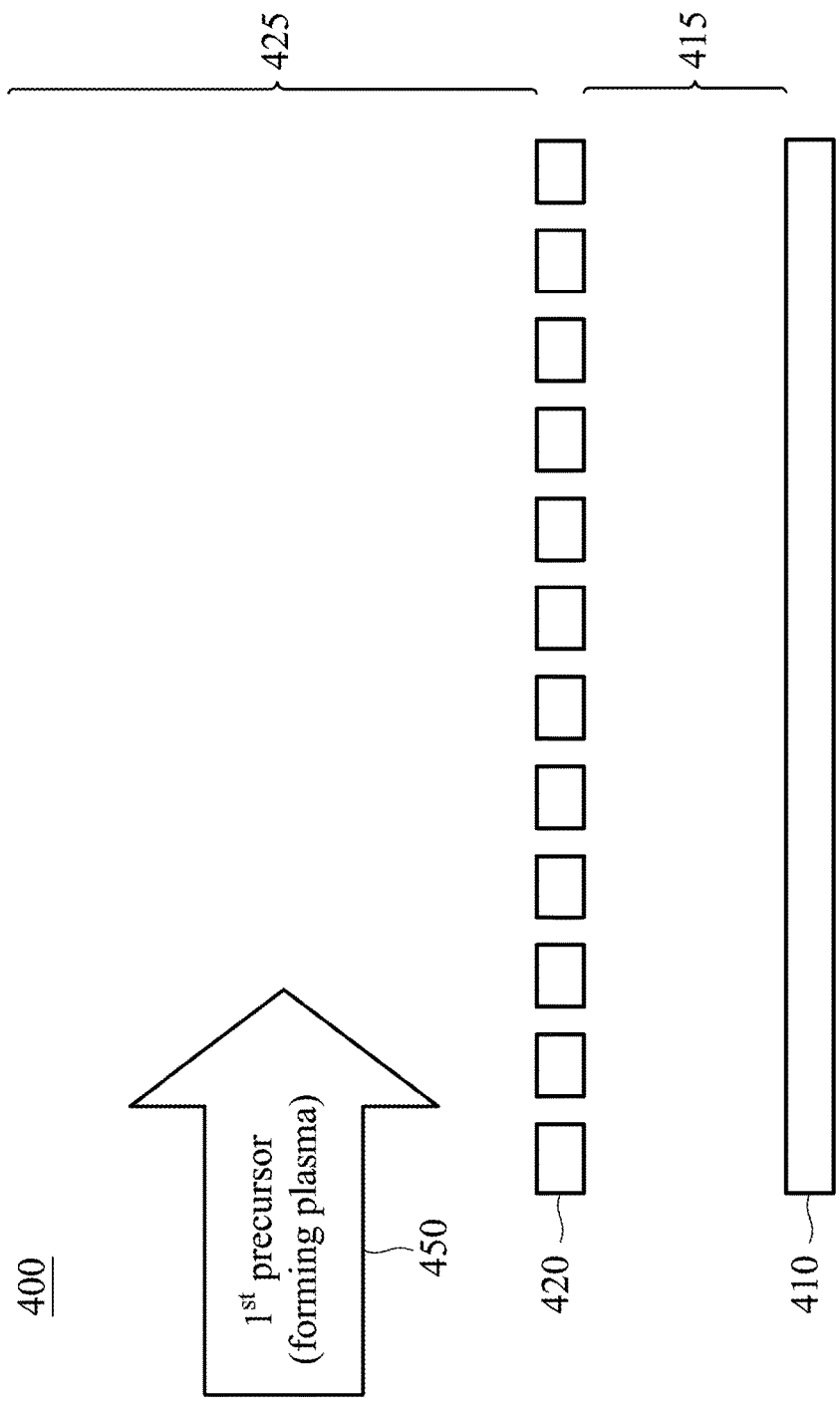
FIG. 4 representatively illustrates introduction of a first precursor to a plasma region, in accordance with an embodiment.

As representatively illustrated in FIG. 4, a system 400 for performing a radical-component selective etch to remove a nitride-containing material includes a plasma region 425 and a wafer processing region 415. Selective modulation device 420 interposes and separates plasma region 425 and wafer processing region 415. Wafer 410 (e.g., having an exposed nitride-containing material disposed thereon) is disposed in wafer processing region 415. First precursor gas 450 is introduced into plasma region 425. Plasma region 425 may be configured with a gas inlet and a gas outlet (not illustrated). Wafer processing region 415 may also be configured with a gas inlet and a gas outlet (not illustrated). In a representative embodiment, first precursor gas 450 may comprise, e.g., nitrogen trifluoride ($NF_3$) as a source of fluorine radical; although other radical sources may be alternatively, conjunctively, or sequentially employed. For example, in other representative embodiments, first precursor gas 450 may comprise sources of other halide radicals (e.g., nitrogen trichloride as a source of chloride radical, or the like). In yet another representative embodiment, first precursor gas 450 may comprise ammonia ($NH_3$) as a source of hydrogen radical. Notwithstanding the preceding plasma precursor gases having been described as including nitrogen, utilizations of other plasma precursor chemicals are also possible in accordance with various other embodiments. Accordingly, it will be understood that first precursor gas 450 is not limited to nitrogen-containing molecules.

Figure 5:
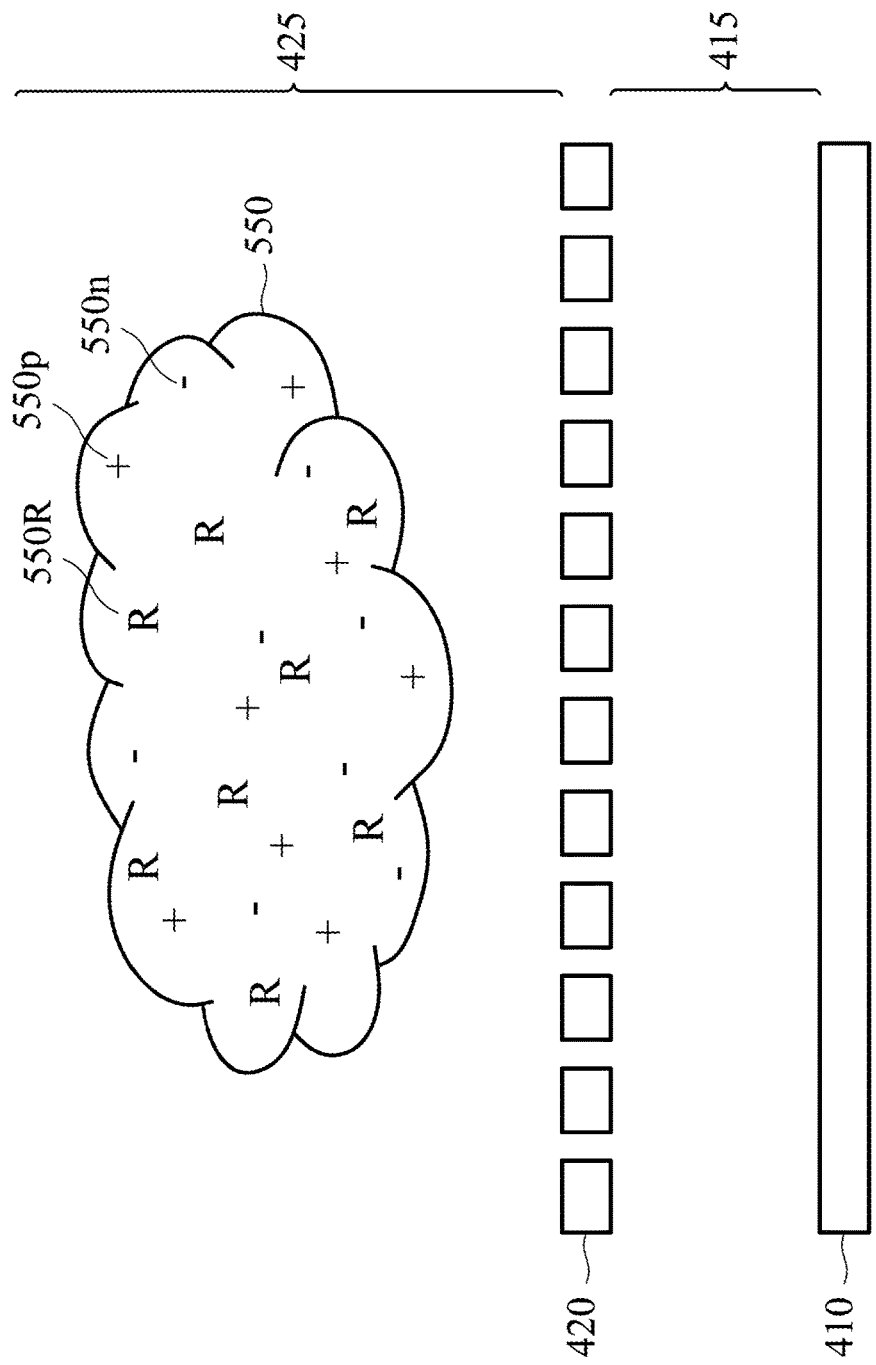
FIG. 5 representatively illustrates formation of a plasma in a plasma region, in accordance with an embodiment.

As representatively illustrated in FIG. 5, first precursor gas 450 is energized to form plasma 500 comprising positive ions 550$p$, negative ions 550$n$, and radical components 550R disposed in plasma region 425. For example, RF (radio frequency) energy may be employed to form plasma 500. In a representative embodiment, the RF power may be between about 10 Watts and about 2500 Watts. In some embodiments, plasma 550 may be generated in a separate region (e.g., as in the case of a remote plasma) and subsequently introduced to plasma region 425.

Figure 6:
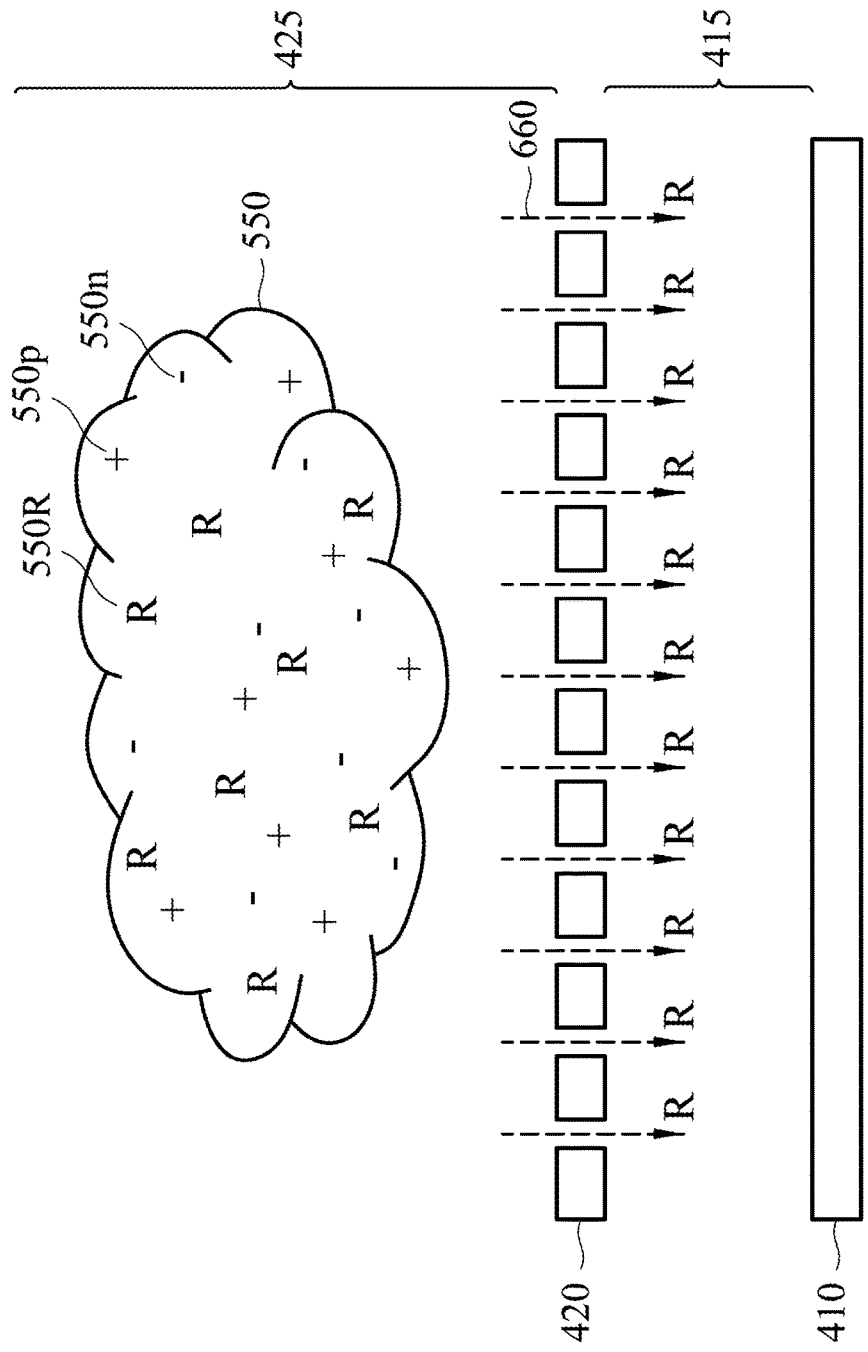
FIG. 6 representatively illustrates separation of a radical component of a plasma, and introduction of the radical component to a substrate processing region, in accordance with an embodiment.

As representatively illustrated in FIG. 6, selective modulation device 420 permits passage 660 of radical components 550R of plasma 550 into wafer processing region 415, while substantially retaining positive ions 550$p$ and negative ions 550$n$ of plasma 550 in plasma region 425. In a representative embodiment, selective modulation device may comprise an electromagnetically charged grating configured to permit uncharged plasma components (e.g., radicals) to pass from plasma region 425 to wafer processing region 415, while retaining (e.g., by attracting or repelling) charged plasma ions in plasma region 425.

Figure 7:
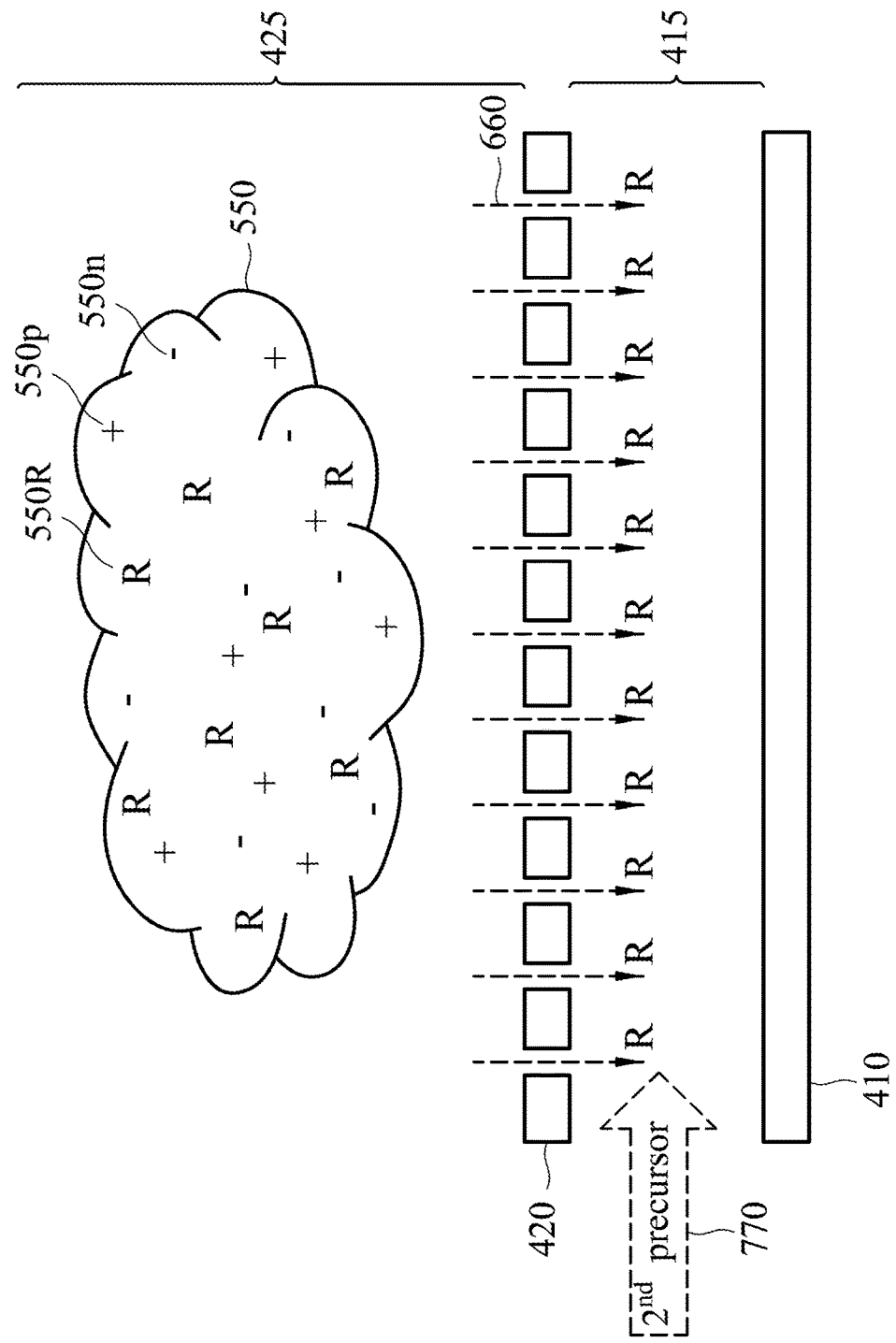
FIG. 7 representatively illustrates introduction of a second precursor to a substrate processing region, in accordance with an embodiment.

As representatively illustrated in FIG. 7, a second precursor gas 770 is introduced into wafer processing region 415 to engage a surface reaction with nitride-containing material disposed on wafer 410. Pressure in the wafer processing region 415 may be between about 5 Torr and about 50 Torr.

In accordance with a representative embodiment employing nitrogen trifluoride ($NF_3$) as first precursor gas 450 and molecular hydrogen ($H_2$) as second precursor gas 770, fluorine (F) radicals of plasma 550 combine with molecular hydrogen ($H_2$) to form a complex of atomic hydrogen (H) and fluorine (F) radical. In a surface adsorption process, the complex of atomic hydrogen (H) and fluorine (F) radical combines with silicon (Si) to form silicon tetrafluoride ($SiF_4$) and molecular hydrogen ($H_2$) as surface desorbed gaseous reaction byproducts.

In accordance with another representative embodiment employing molecular hydrogen ($H_2$) as first precursor gas 450 and hydrofluoric acid (HF) as second precursor gas 770, hydrogen (H) radicals of plasma 550 combine with silicon (Si) in a surface adsorption process to produce a complex of silicon (Si) and hydrogen (H) radical. The silicon (Si) and hydrogen radical complex reacts with gaseous hydrofluoric acid (HF) to produce a silicon (Si) and fluorine (F) surface complex with desorption of molecular hydrogen ($H_2$). The silicon (Si) and fluorine (F) surface complex further reacts with hydrogen (H) radical and gaseous hydrofluoric acid (HF) to form silicon tetrafluoride ($SiF_4$) and molecular hydrogen ($H_2$) as surface desorbed gaseous reaction byproducts.

In accordance with yet another representative embodiment employing molecular hydrogen ($H_2$) and molecular fluorine ($F_2$) as precursor gases, fluorine (F) radicals combine with silicon (Si) of silicon nitride ($Si_3N_4$) in a surface adsorption/desorption process in accordance with the following: $6H_2 + 6F_2 + Si_3N_4 \rightarrow 3SiF_4 + 4NH_3$. A silicon (Si) and fluorine (F) surface complex (silicon tetrafluoride, $SiF_4$) is produced with desorption of gaseous ammonia ($NH_3$).

Figure 8:
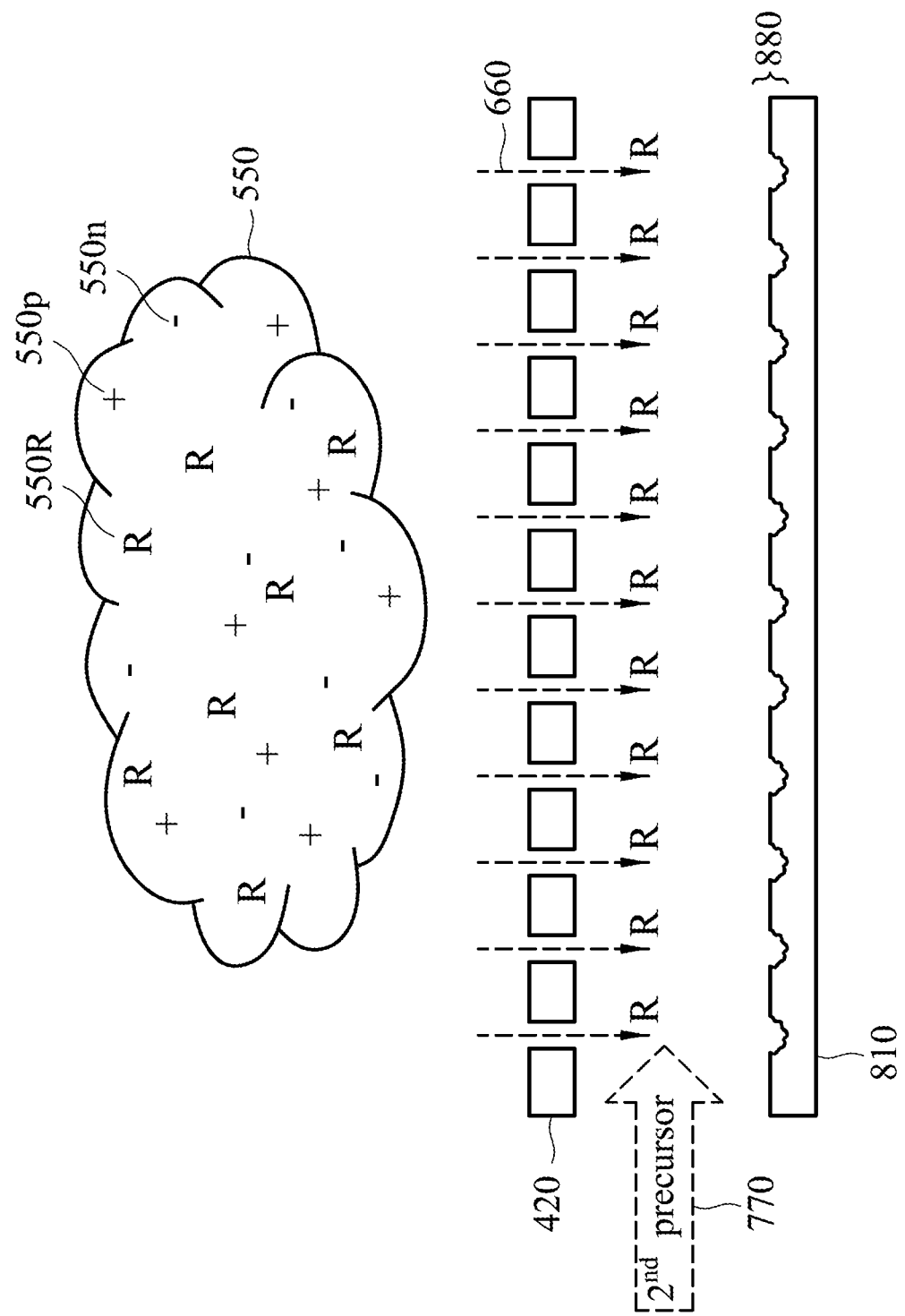
FIG. 8 representatively illustrates etching of exposed nitride material from the surface of a substrate with reaction products of a radical component of a plasma and a second precursor, in accordance with an embodiment.
Figure 9:
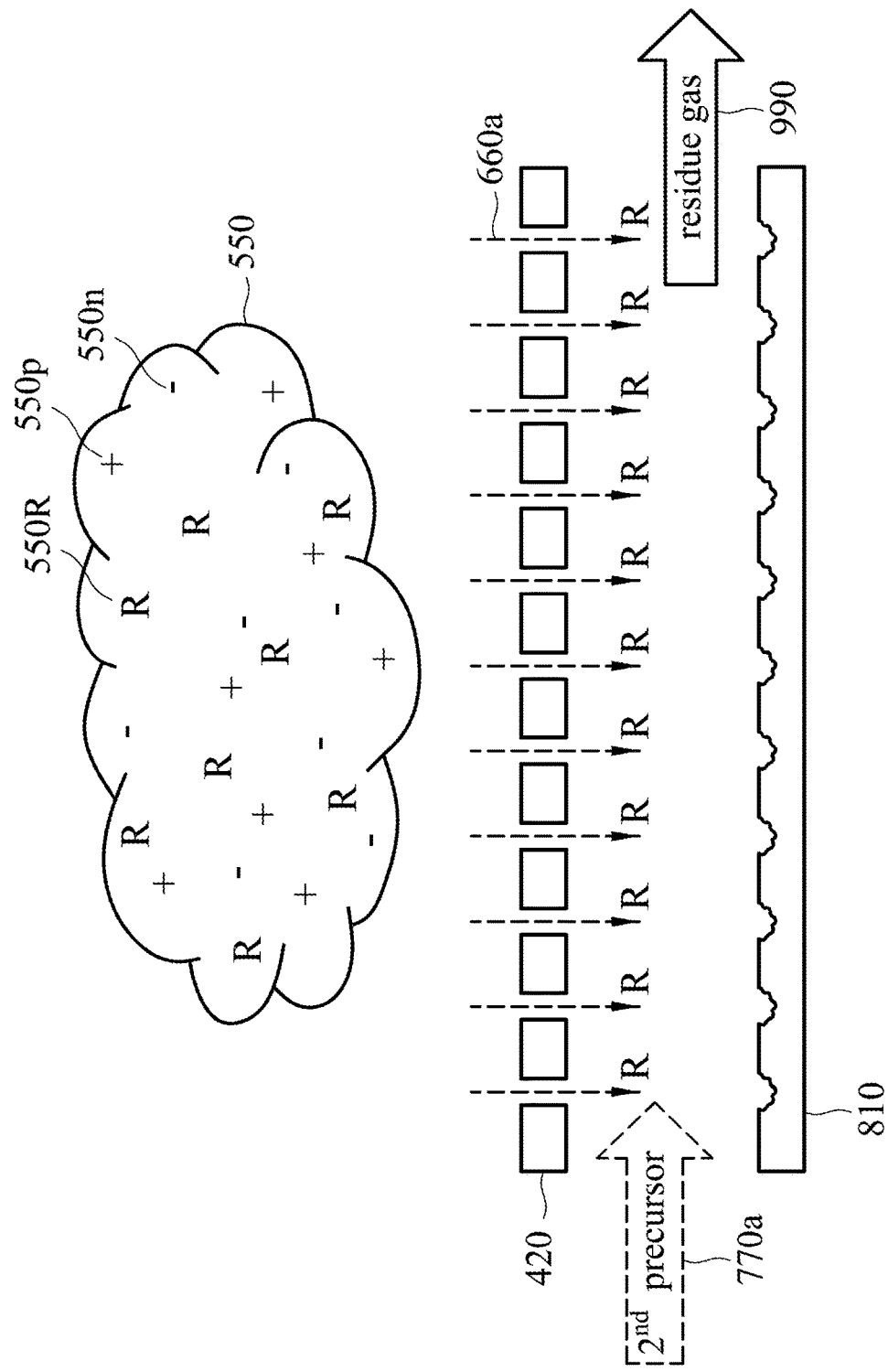
FIG. 9 representatively illustrates removal of gaseous residue from a substrate processing region, in accordance with an embodiment.

As representatively illustrated in FIG. 8, the surface reaction removes (e.g., etches) nitride-containing material portions 880 from wafer 410 to produce etched wafer 810. As representatively illustrated in FIG. 9, resulting byproducts of the surface reaction to remove nitride-containing material comprise gaseous residue 990 that may be flowed away from etched wafer 810 and out of wafer processing region 415. Etch treatment time may proceed for a duration of time between about 1 seconds and about 5 minutes.

In accordance with representative embodiments described herein, selectivities of silicon nitride (SiN) etch rate to silicon oxide ($SiO_x$) etch rate of up to about 50:1 or more may be observed (e.g., a silicon nitride etch rate that is greater than a silicon oxide etch rate by a multiplicative factor of about 50).

Figure 12:
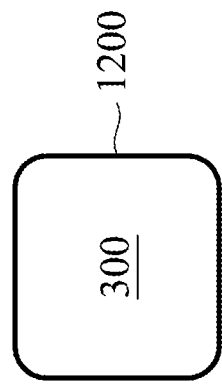
FIG. 12 representatively illustrates a method of etching a nitride-containing material of a FinFET, in accordance with yet another embodiment.
Figure 10:
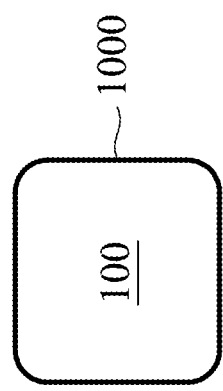
FIG. 10 representatively illustrates a method of etching a nitride-containing material of a fin field-effect transistor (FinFET), in accordance with an embodiment.
Figure 11:
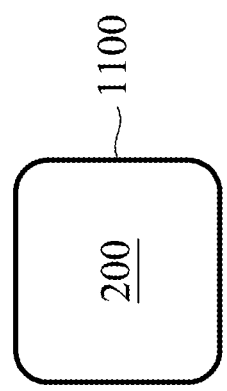
FIG. 11 representatively illustrates a method of etching a nitride-containing material of a FinFET, in accordance with other embodiments.

As representatively illustrated in FIG. 10, a process 1000 of selectively etching a nitride-containing material from a surface of a fin field-effect transistor (FinFET) device may be performed in accordance with the method 100 representatively illustrated in FIG. 1. As representatively illustrated in FIG. 11, a process 1100 of selectively etching a nitride-containing material from a surface of a FinFET device may be performed in accordance with the method 200 representatively illustrated in FIG. 2. As representatively illustrated in FIG. 12, a process 1200 of selectively etching a nitride-containing material from a surface of a FinFET device may be performed in accordance with the method 300 representatively illustrated in FIG. 3.

Figure 13:
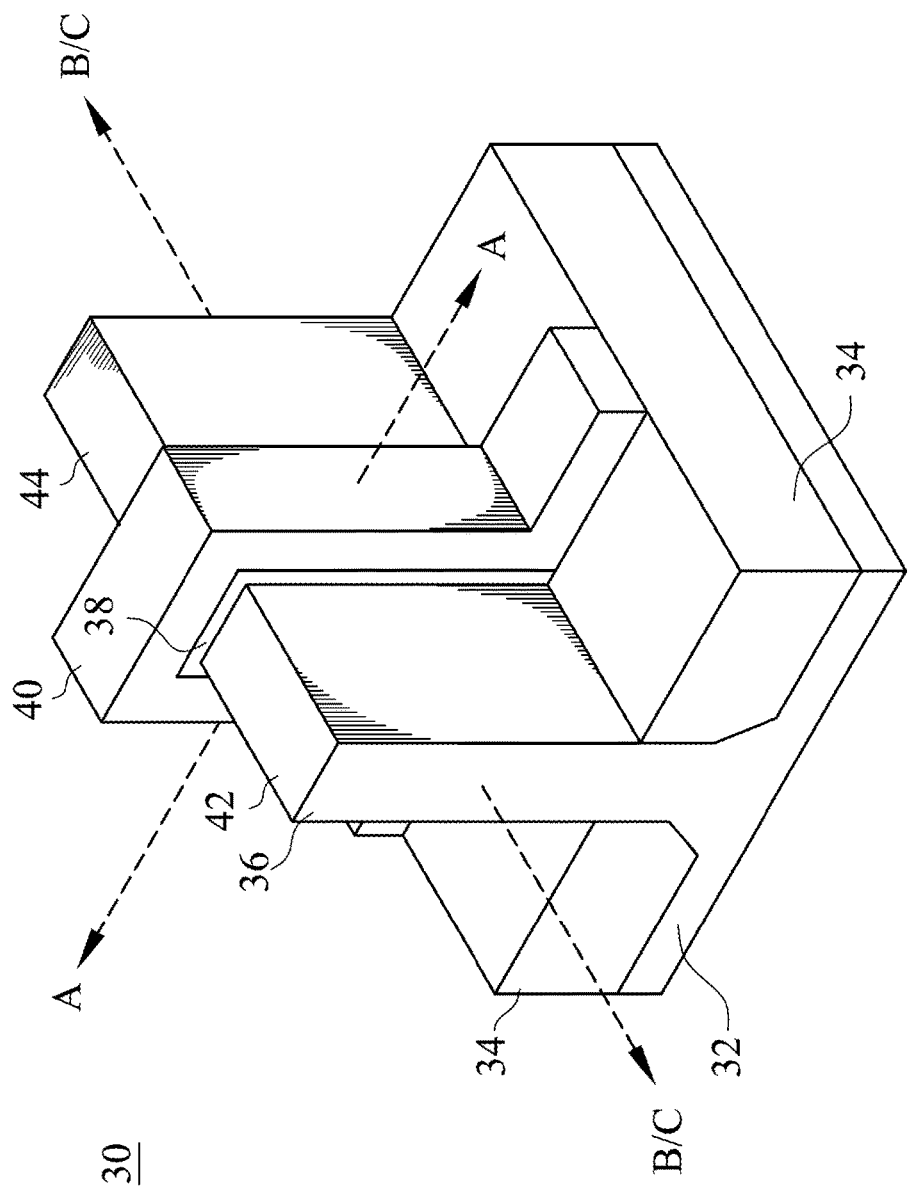
FIG. 13 is a three-quarter isometric view of a representative FinFET, in accordance with some embodiments.

FIG. 13 illustrates a representative FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 13 further illustrates cross-sections for reference in later Figures. Cross-section A-A is across a channel, gate dielectric 38, and gate electrode 40 of FinFET 30. Cross-section B/C-B/C is perpendicular to cross-section A-A and is along a longitudinal axis of fin 36 and in a direction of, e.g., a current flow between source/drain regions 42 and 44. Subsequent Figures refer to these reference cross-sections for clarity by designation as 'Na' (when referring to the A-A cross-section), 'Nb' (when referring to the B-B cross-section), and 'Nc" (when referring to the C-C cross-section), where 'N' is the cardinal number reference for a particular Figure.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 14 through 27c are cross-sectional views of intermediate stages in the manufacture of FinFETs in accordance with a representative embodiment. FIGS. 14 through 18 illustrate reference cross-section A-A illustrated in FIG. 13, in an embodiment for the fabrication of multiple FinFETs. In FIGS. 19a through 27c, Figures ending with an 'a' designation are illustrated along a common cross-section A-A; Figures ending with a 'b' designation are illustrated along a common cross-section B/C-B/C and in a first region of a substrate; and Figures ending with a 'c' designation are illustrated along a common cross-section B/C-B/C and in a second region of a substrate.

Figure 14:
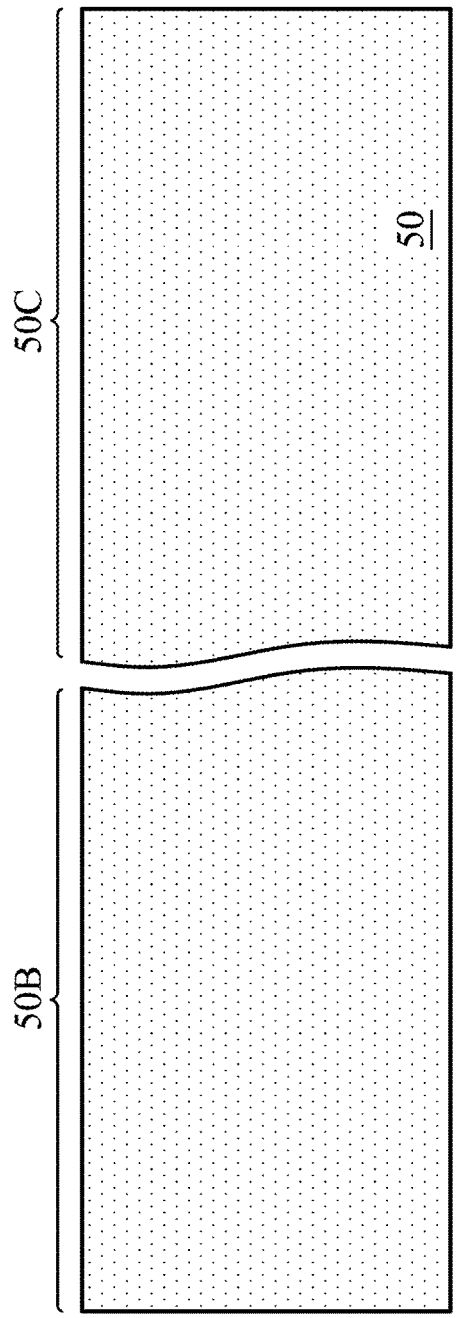

FIG. 14 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. Substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 50 may include silicon; germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof.

Substrate 50 has a first region 50B and a second region 50C. First region 50B (generally corresponding to subsequent Figures labelled 'b') may be provided for forming n-type devices, such as NMOS transistors, e.g., n-type FinFETs. Second region 50C (generally corresponding to subsequent Figures labelled 'c') may be provided for forming p-type devices, such as PMOS transistors, e.g., p-type FinFETs.

Figure 15:
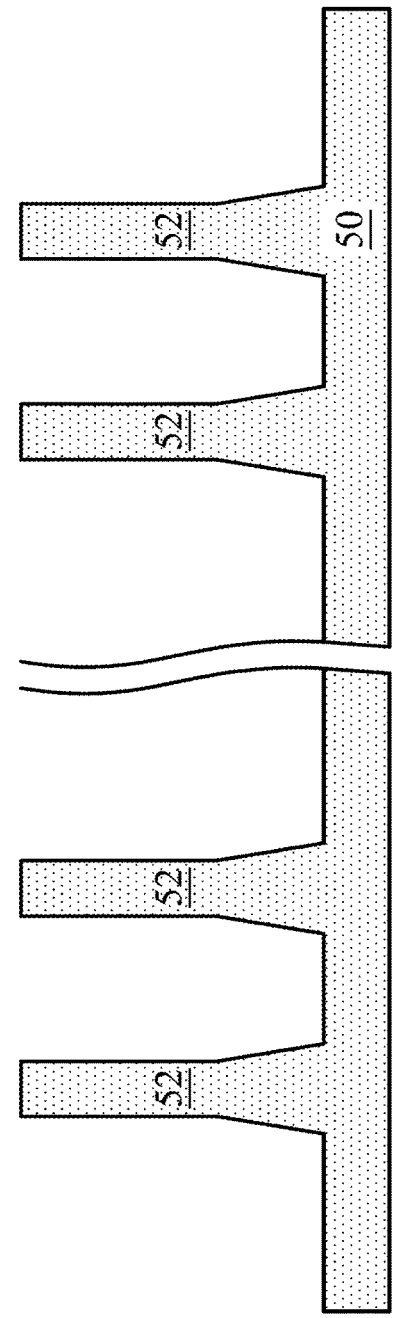

FIGS. 15 and 16 illustrate formation of fins 52 and isolation regions 54 between neighboring fins 52. In FIG. 15, fins 52 are formed in substrate 50. In some embodiments, fins 52 may be formed in substrate 50 by etching trenches in substrate 50. The etching may be any acceptable etch process, such as a reactive ion etch (RIE), neutral beam etch (NBE), the like, or a combination thereof. The etch may be anisotropic.

In FIG. 16 an insulation material 54 is formed between neighboring fins 52 to form isolation regions 54. Insulation material 54 may be an oxide, such as silicon oxide, a nitride, the like, or a combination thereof, and may be formed by a high density plasma chemical vapor deposition (HDP- CVD), a flowable CVD (i) (e.g., a CVD-based material deposition in a remote plasma system and post curing for conversion to another material, such as an oxide), the like, or a combination thereof. Other insulation materials formed by any acceptable process may be used. An annealing process may be performed after the insulation material is formed. In the illustrated embodiment, insulation material 54 may comprise silicon oxide formed by a FCVD process. Insulating material 54 may be referred to as isolation regions 54. In FIG. 15, a planarization process, such as a chemical mechanical polish (CMP), may remove excess insulation material 54 and form top surfaces of isolation regions 54 and top surfaces of fins 52 that are coplanar with respect to each other.

FIG. 17 illustrates recessing of isolation regions 54 to form shallow trench isolation (STI) regions 54. Isolation regions 54 are recessed such that fins 56 in first region 50B and in second region 50C protrude from between neighboring isolation regions 54. Further, top surfaces of isolation regions 54 may have a flat surface as illustrated, a convex surface, a concave surface (as resulting from, e.g., dishing), or a combination thereof. Top surfaces of isolation regions 54 may be formed flat, convex, and/or concave by an appropriate etch. Isolation regions 54 may be recessed using an acceptable etching process, such as one that is selective to material of the isolation regions 54. For example, a chemical oxide removal using a CERTAS® etch or an Applied Materials SICONI tool or dilute hydrofluoric (dHF) acid may be used.

The process described with respect to FIGS. 15 through 17 is just one example of how fins 56 may be formed. In other embodiments, a dielectric layer may be formed over a top surface of substrate 50; trenches may be etched through the dielectric layer; homo-epitaxial structures may be epitaxially grown in the trenches; and the dielectric layer may be recessed such that the homo-epitaxial structures protrude from the dielectric layer to form fins. In still other embodiments, hetero-epitaxial structures may be used for the fins. For example, semiconductor strips 52 in FIG. 16 may be recessed, and a material different from semiconductor strips 52 may be epitaxially grown in their place. In still another embodiment, a dielectric layer may be formed over a top surface of substrate 50; trenches may be etched through the dielectric layer; hetero-epitaxial structures may be epitaxially grown in the trenches using a material different than that of substrate 50; and the dielectric layer may be recessed such that the hetero-epitaxial structures protrude from the dielectric layer to form fins 56. In some embodiments where homo- or hetero-epitaxial structures are grown, the grown materials may be in situ doped during growth, which may obviate prior and subsequent implantations, although in situ and implantation doping may be used together. Still further, it may be advantageous to epitaxially grow a material in an NMOS region different than that of material in a PMOS region. In various representative embodiments, fins 56 may comprise silicon germanium ($Si_xGe_{1-x}$, where x is between about 0 and about 100), silicon carbide, pure or substantially pure germanium, a III-V compound semiconductor, a II-VI compound semiconductor, or the like. For example, representative materials for forming III-V compound semiconductor include, but are not limited to, InAs, AlAs, GaAs, InP, GaN, InGaAs, InAlAs, GaSb, AlSb, AlP, GaP, and the like.

In FIG. 17, wells may be formed in fins 56, fins 52, and/or substrate 50. For example, a P well may be formed in first region 50B, and an N well may be formed in second region 50C.

Different implant steps for different regions 50B and 50C may be employed using a photoresist or other masks (not shown). For example, a photoresist may be formed over fins 56 and isolation regions 54 in first region 50B. The photoresist is patterned to expose second region 50C of substrate 50 (e.g., PMOS region). The photoresist may be formed by using a spin-on technique and may be patterned using acceptable photolithography techniques. Once the photoresist is patterned, an n-type impurity implant may be performed in second region 50C, and the photoresist may act as a mask to substantially prevent n-type impurities from being implanted into first region 50B (e.g., NMOS region). The n-type impurities may be phosphorus, arsenic, or the like implanted in the first region to a concentration of equal to or less than about $10^{18}$ cm$^{-3}$, such as in a range from about $10^{17}$ cm$^{-3}$ to about $10^{18}$ cm$^{-3}$. After implantation, the photoresist is removed, such as by an acceptable ashing process.

Following implantation to second region 50C, a photoresist is formed over fins 56 and isolation regions 54 in second region 50C. The photoresist is patterned to expose first region 50B of substrate 50 (e.g., NMOS region). The photoresist can be formed by using a spin-on technique and can be patterned using acceptable photolithography techniques. Once the photoresist is patterned, a p-type impurity implant may be performed in first region 50B, and the photoresist may act as a mask to substantially prevent p-type impurities from being implanted into the second region, e.g., the PMOS region. The p-type impurities may be boron, $BF_2$, or the like implanted in the first region to a concentration of equal to or less than about $10^{18}$ cm$^{-3}$, such as in a range from about $10^{17}$ cm$^{-3}$ to about $10^{18}$ cm$^{-3}$. After implantation, the photoresist may be removed, such as by an acceptable ashing process.

After implantation to first region 50B and second region 50C, an anneal may be performed to activate the p-type and n-type impurities that were implanted. The implantations may form a p-well in first region 50B (e.g., NMOS region), and an n-well in second region 50C (e.g., PMOS region). In some embodiments, the grown materials of epitaxial fins may be in situ doped during growth, which may obviate the implantations, although in situ and implantation doping may be used in conjunction with each other.

Figure 18:
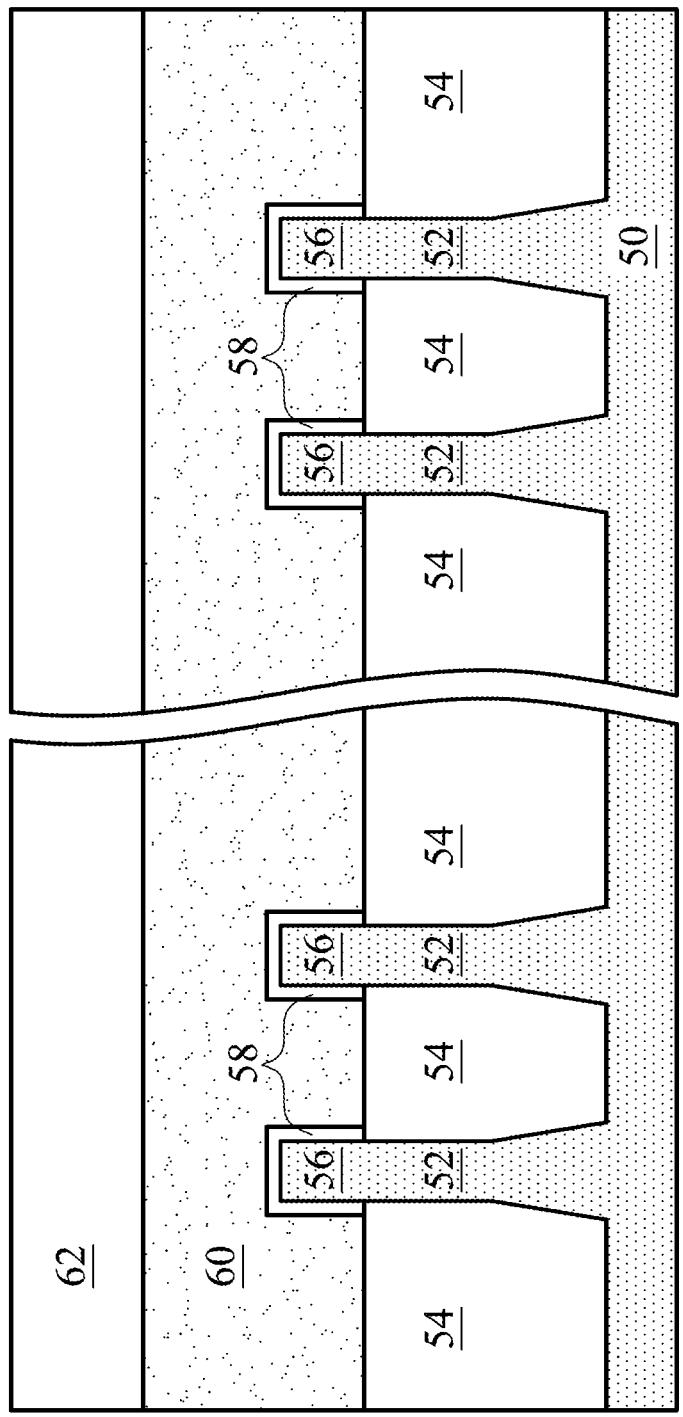

In FIG. 18, a dummy dielectric layer 58 is formed on fins 56. The dummy dielectric layer 58 may be, for example, silicon oxide, silicon nitride, a combination thereof, or the like, and may be deposited or thermally grown according to acceptable techniques. A dummy gate layer 60 is formed over dummy dielectric layer 58, and a mask layer 62 is formed over dummy gate layer 60. Dummy gate layer 60 may be deposited over dummy dielectric layer 58 and then planarized, such as by a CMP. Mask layer 62 may be deposited over dummy gate layer 60. Dummy gate layer 60 may be made of, for example, polysilicon, although other materials having a high etch selectivity from the etching of isolation regions 54 may also be used. Mask layer 62 may include, for example, silicon nitride or the like. In this example, a single dummy gate layer 60 and a single mask layer 62 are formed across first region 50B and second region 50C. In other embodiments, separate dummy gate layers may be formed in first region 50B and second region 50C, and separate mask layers may be formed in first region 50B and second region 50C.

Figure 19A:
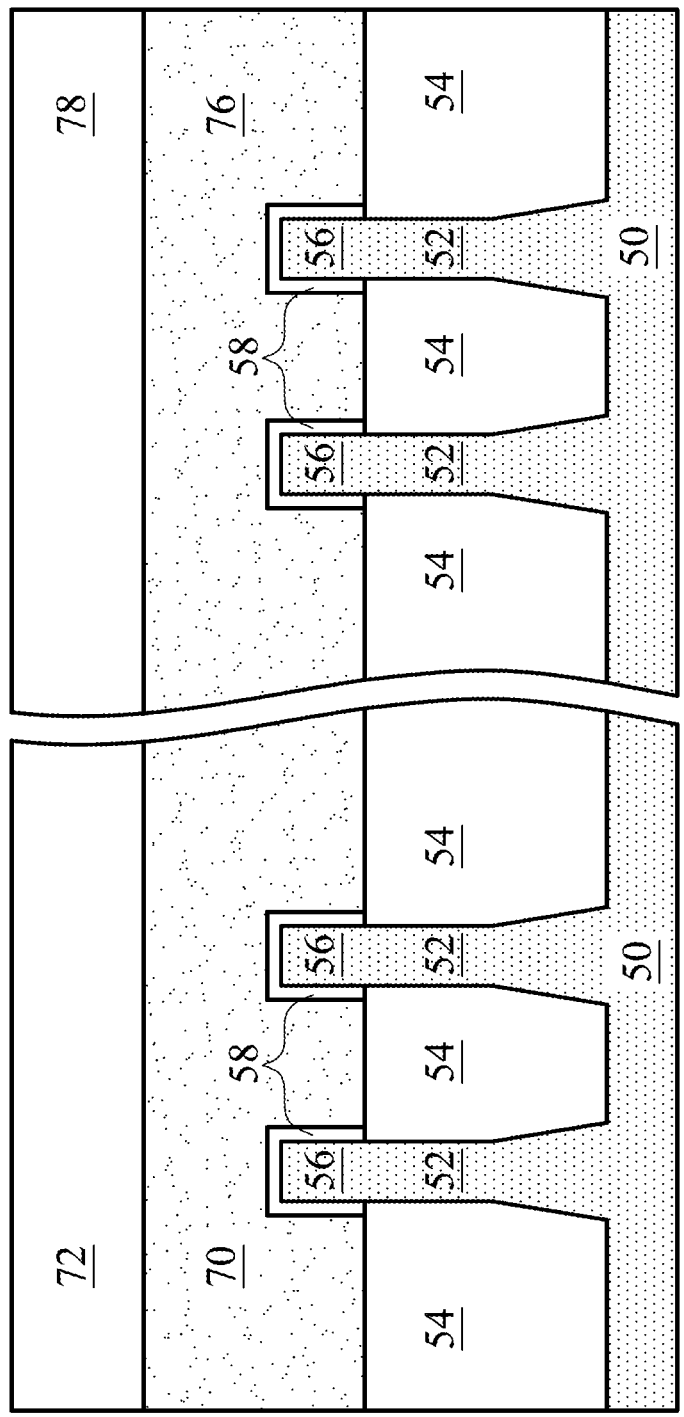
Figure 19C:
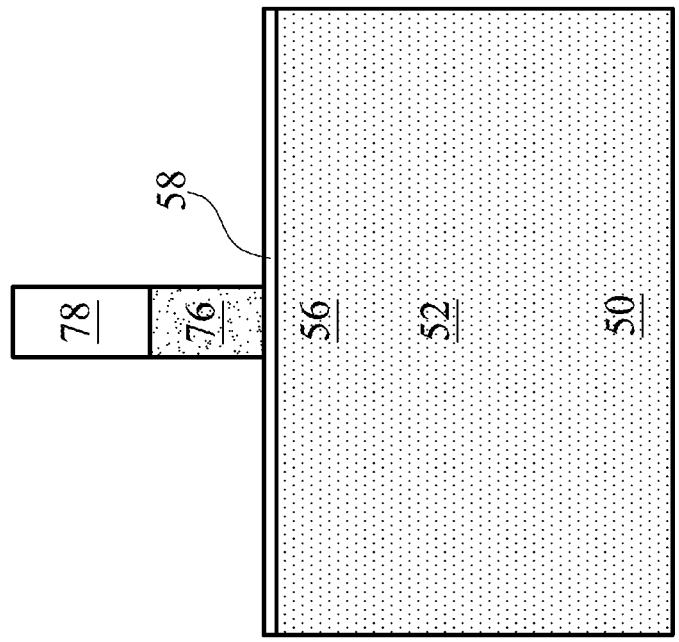
Figure 19B:
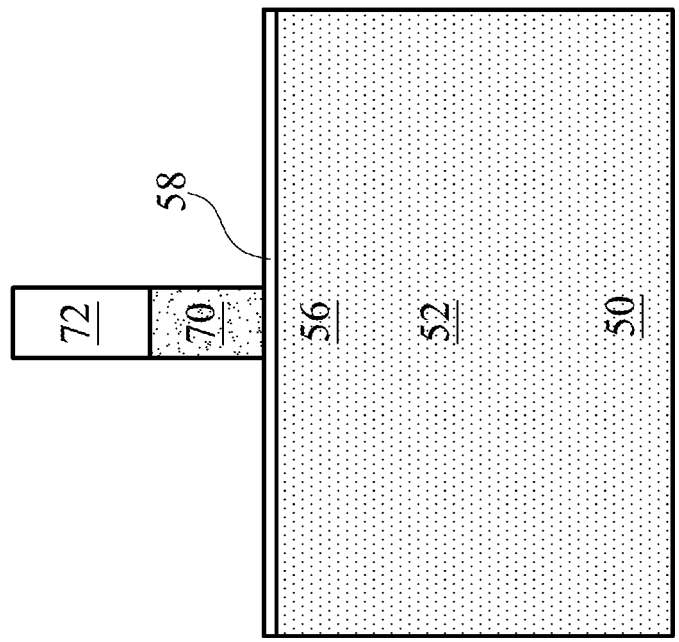

In FIGS. 19a, 19b, and 19c, mask layer 62 may be patterned using acceptable photolithography and etching techniques to form masks 72 in first region 50B (as illustrated in FIG. 19b) and masks 78 in second region 50C (as illustrated in FIG. 19c). The pattern of mask 72 and mask 78 may then be transferred to dummy gate layer 60 and dummy dielectric layer 58 by an acceptable etching technique to form dummy gates 70 in first region 50B and dummy gates 76 in second region 50C. Dummy gates 70 and 76 cover respective channel regions of the fins 56. Dummy gates 70 and 76 may also have a lengthwise direction substantially perpendicular to the lengthwise direction of respective epitaxial fins.

In representative embodiments, mask layer 62 (or any other nitride-containing FinFET layer disclosed herein) may be etched with a radical-containing plasma component (e.g., of a first precursor gas) in combination with an unexcited gas (e.g., a second precursor gas) to selectively remove nitride-containing material without producing, or otherwise substantially reducing, residue on remaining device layer features.

Figure 20A:
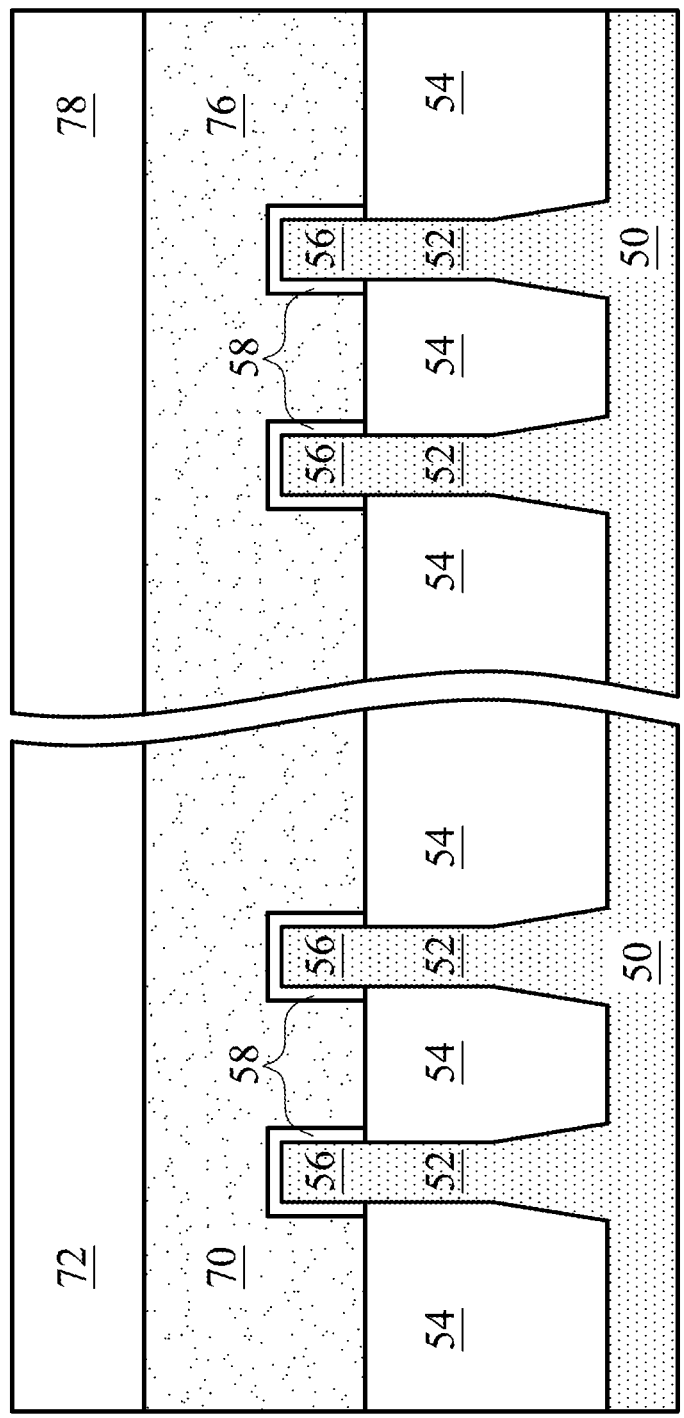
Figure 20C:
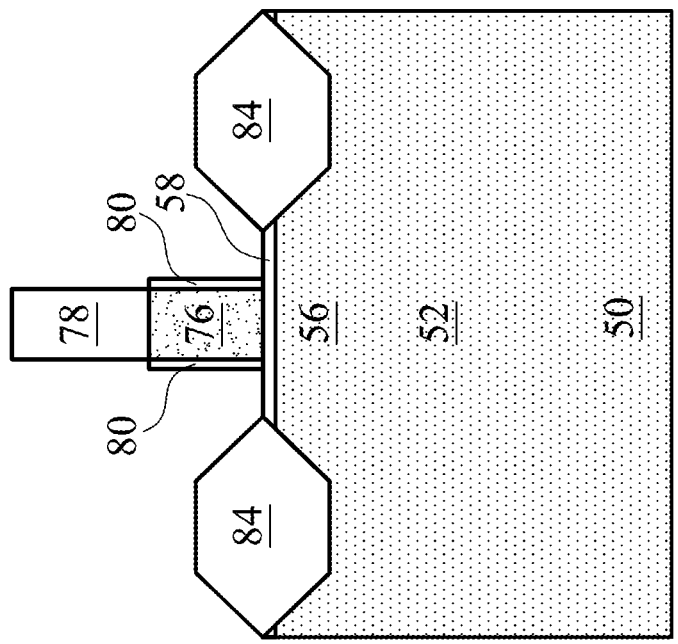
Figure 20B:
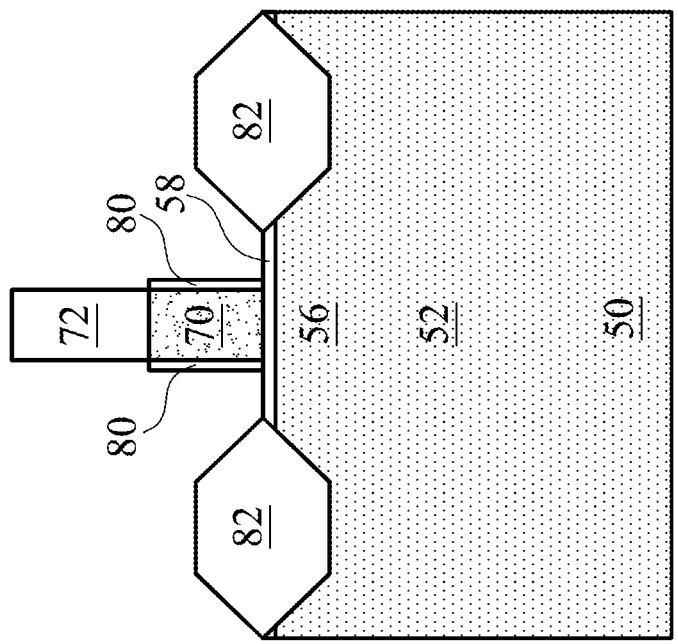

In FIGS. 20a, 20b, and 20C, gate seal spacers 80 are formed on exposed surfaces of respective dummy gates 70 and 76 and/or fins 56. A thermal oxidation or a deposition followed by an anisotropic etch may form gate seal spacers 80.

After formation of gate seal spacers 80, implants for lightly doped source/drain (LDD) regions may be performed. Similar to the implants discussed above with respect to FIG. 17, a mask, such as a photoresist, may be formed over first region 50B (e.g., NMOS region), while exposing second region 50C (e.g., PMOS region), and p-type impurities may be implanted to exposed fins 56 in second region 50C. The mask may then be removed. Subsequently, a mask, such as a photoresist, may be formed over second region 50C while exposing first region 50B, and n-type impurities may be implanted to exposed fins 56 in first region 50B. The mask may then be removed. The n-type impurities may be the any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 20a, 20b, and 20C, epitaxial source/drain regions 82 and 84 are formed in fins 56. In first region 50B, epitaxial source/drain regions 82 are formed in fins 56 such that each dummy gate 70 is disposed between respective neighboring pairs of epitaxial source/drain regions 82. In some embodiments, epitaxial source/drain regions 82 may extend into fins 52. In second region 50C, epitaxial source/drain regions 84 are formed in fins 56 such that each dummy gate 76 is disposed between respective neighboring pairs of epitaxial source/drain regions 84. In some embodiments, epitaxial source/drain regions 84 may extend into fins 52.

Epitaxial source/drain regions 82 in first region 50B (e.g., NMOS region) may be formed by masking second region 50C (e.g., PMOS region), and conformally depositing a dummy spacer layer in first region 50B followed by an anisotropic etch to form dummy gate spacers (not shown) along sidewalls of dummy gates 70 and/or gate seal spacers 80 in first region 50B. Thereafter, source/drain regions of the epitaxial fins in first region 50B are etched to form recesses. Epitaxial source/drain regions 82 in first region 50B are epitaxially grown in the recesses. Epitaxial source/drain regions 82 may include any acceptable material, such as appropriate for n-type FinFETs. For example, if fin 56 is silicon, epitaxial source/drain regions 82 may include silicon, SiC, SiCP, SiP, or the like. Epitaxial source/drain regions 82 may have surfaces raised from respective surfaces of fins 56 or may have facets. Subsequently, the dummy gate spacers in first region 50B are substantially removed, for example, by an etch, as is the mask on second region 50C.

Epitaxial source/drain regions 84 in second region 50C (e.g., PMOS region) may be formed by masking first region 50B (e.g., NMOS region), and conformally depositing a dummy spacer layer in second region 50C followed by an anisotropic etch to form dummy gate spacers (not shown) along sidewalls of dummy gates 76 and/or gate seal spacers 80 in second region 50C. Thereafter, source/drain regions of the epitaxial fins in second region 50C are etched to form recesses. Epitaxial source/drain regions 84 in second region 50C are epitaxially grown in the recesses. Epitaxial source/drain regions 84 may include any acceptable material, such as appropriate for p-type FinFETs. For example, if fin 56 is silicon, epitaxial source/drain regions 84 may comprise SiGe, SiGeB, Ge, GeSn, or the like. Epitaxial source/drain regions 84 may have surfaces raised from respective surfaces of fins 56 or may have facets. Subsequently, the dummy gate spacers in second region 50C are substantially removed, for example, by an etch, as is the mask on first region 50B.

Figure 21A:
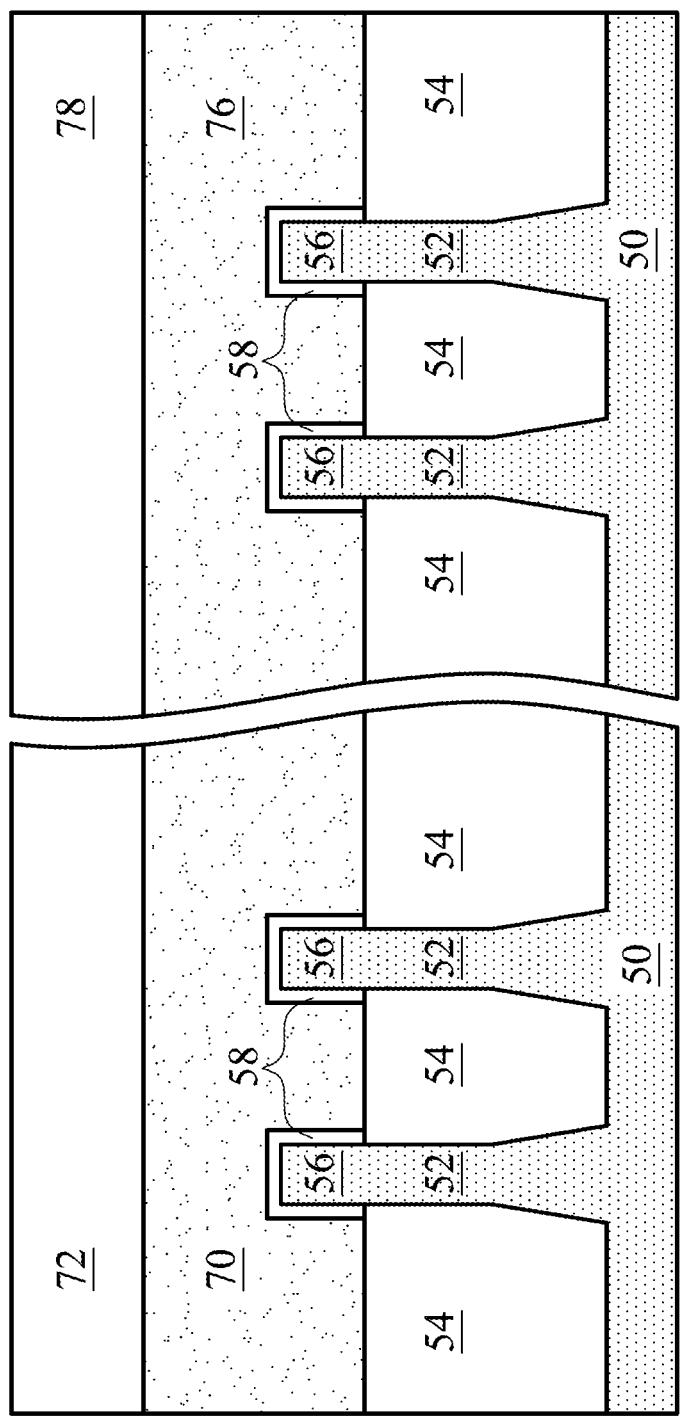
Figure 21C:
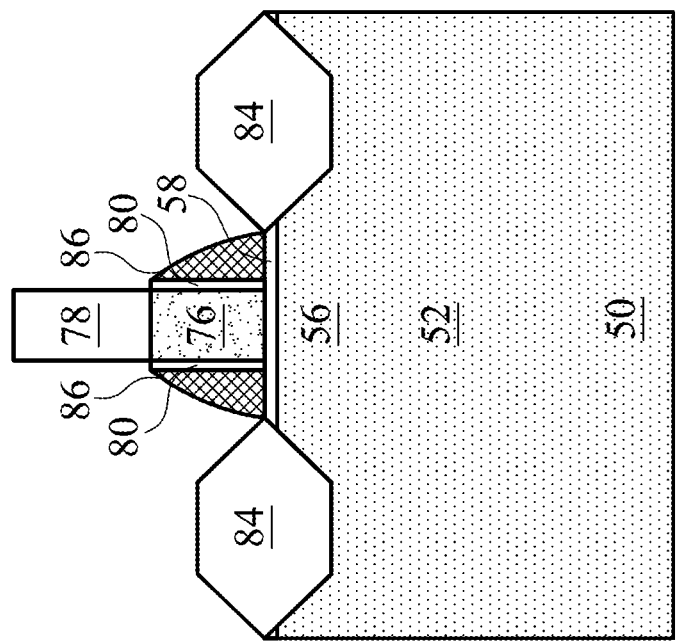
Figure 21B:
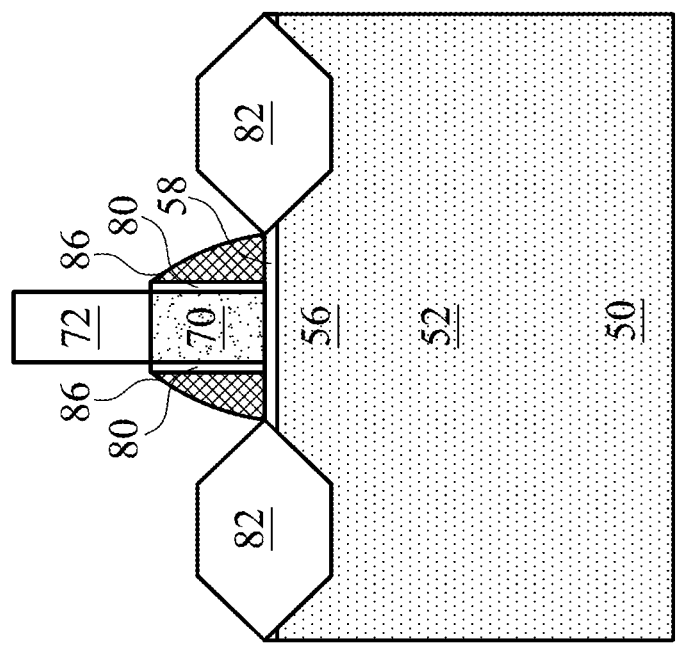

In FIGS. 21a, 21b, and 21c, gate spacers 86 are formed on gate seal spacers 80 along sidewalls of dummy gates 70 and 76. Gate spacers 86 may be formed by conformally depositing a material and subsequently anisotropically etching the material. The material of gate spacers 86 may be silicon nitride, SiCN, a combination thereof, or the like.

Epitaxial source/drain regions 82 and 84 and/or epitaxial fins may be implanted with dopants to form source/drain regions, similar to the process previously discussed for forming lightly doped source/drain regions, followed by annealing. The source/drain regions may have an impurity concentration in a range from about $10^{19}$ cm$^{-3}$ to about $10^{21}$ cm$^{-3}$. The n-type impurities for source/drain regions in first region 50B (e.g., NMOS region) may be any of the n-type impurities previously discussed, and the p-type impurities for source/drain regions in second region 50C (e.g., PMOS region) may be any of the p-type impurities previously discussed. In other embodiments, epitaxial source/drain regions 82 and 84 may be in situ doped during growth.

Figure 22A:
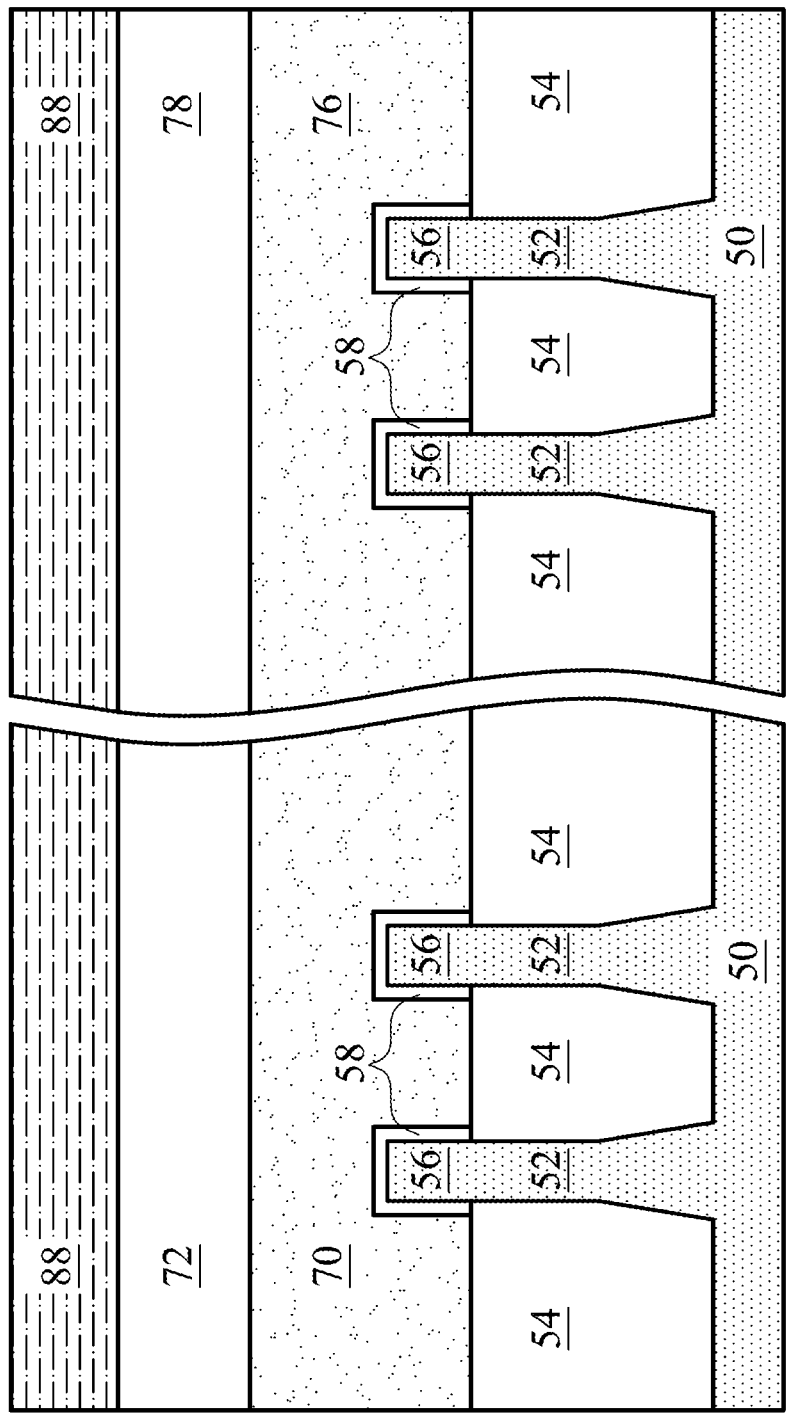
Figure 22C:
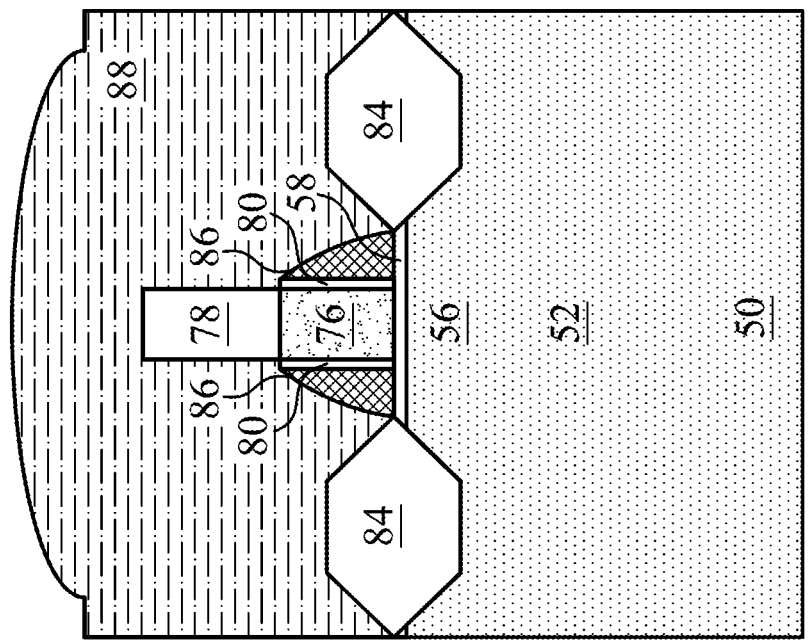
Figure 22B:
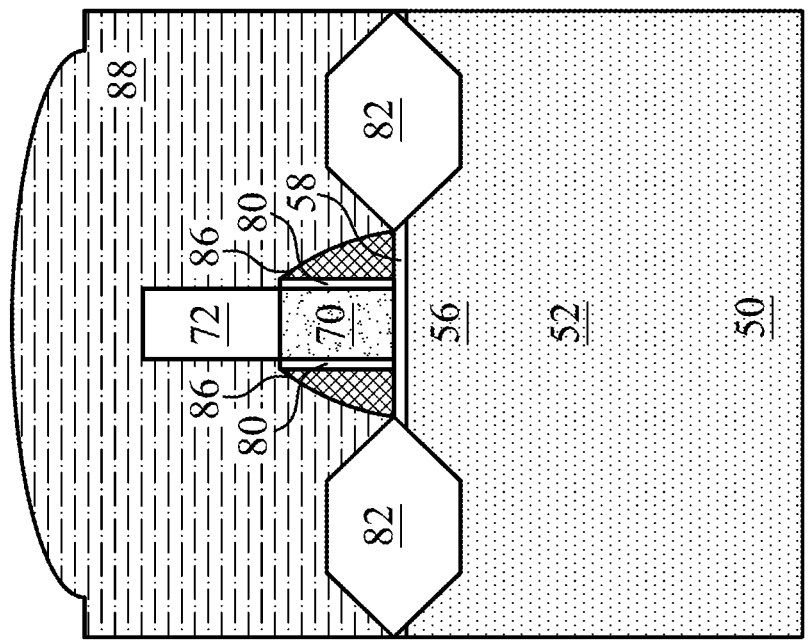

In FIGS. 22a, 22b, and 22C, an ILD 88 is deposited over the structure illustrated in FIGS. 21a, 21b, and 21c. In a representative embodiment, ILD 88 is a film formed by a flowable CVD. In some embodiments, ILD 88 may be formed of a dielectric material such as phosphosilicate glass (PSG), borosilicate glass (BSG), boron-doped phosphosilicate glass (BPSG), undoped silicate glass (USG), or the like, and may be deposited by any suitable method, such as CVD, or PECVD.

Figure 23A:
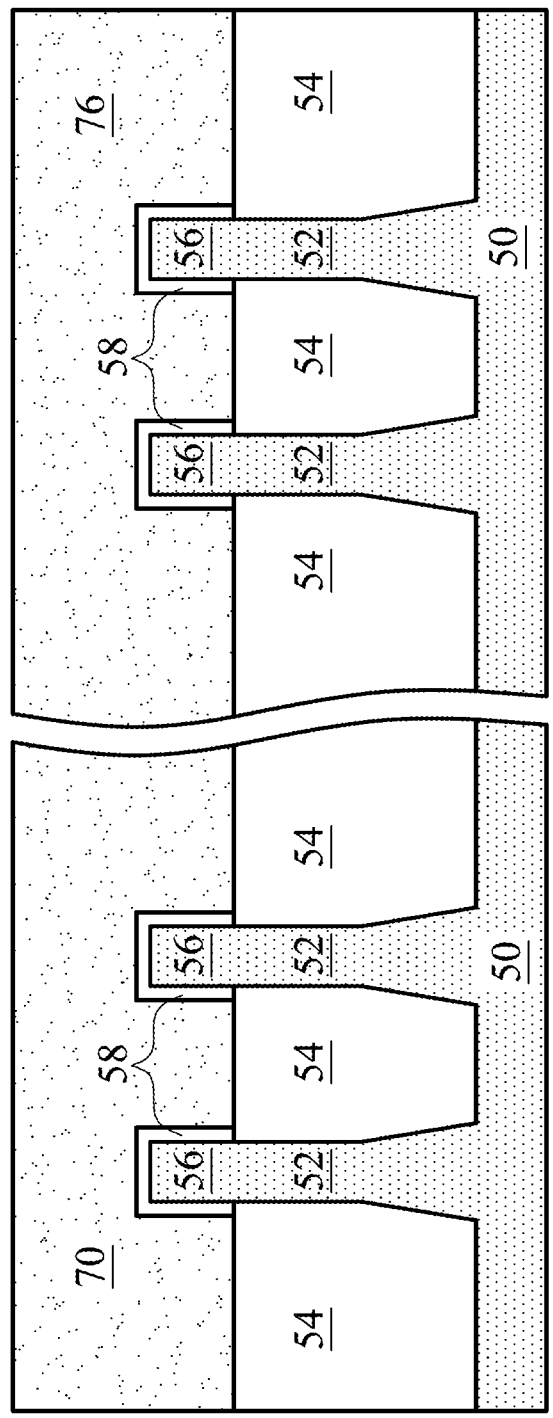
Figure 23B:
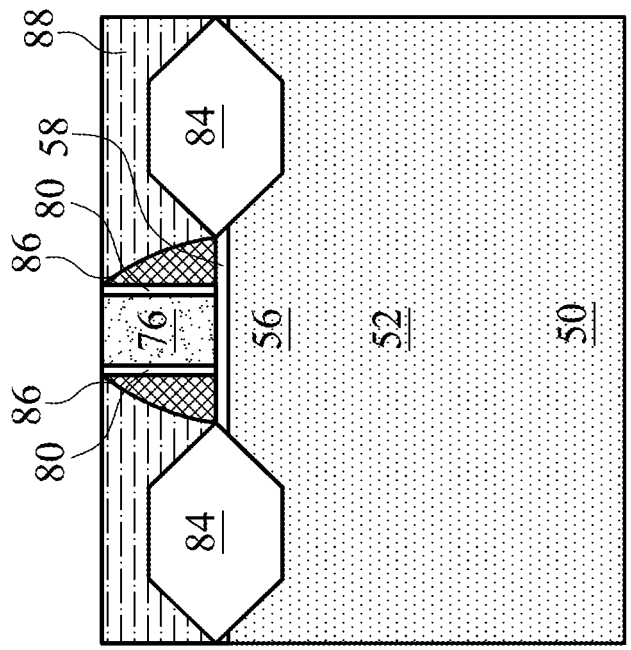
Figure 23C:
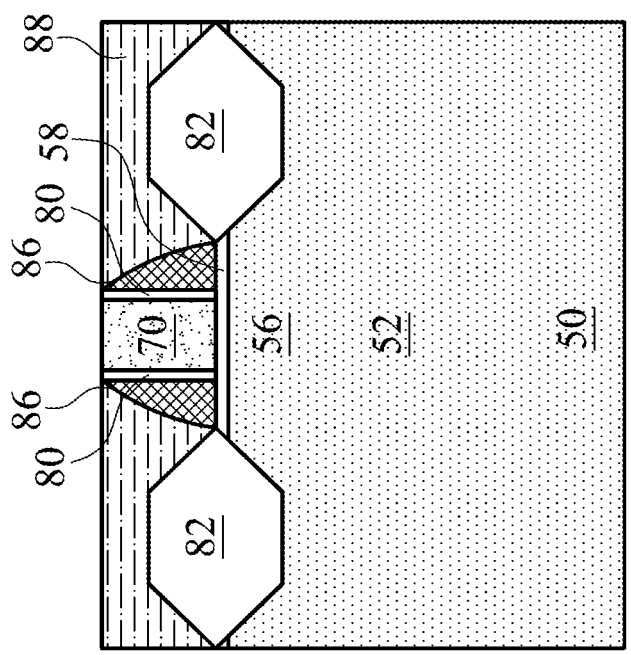

In FIGS. 23a, 23b, and 23c, a planarization process, such as a CMP, may be performed to level top surface of ILD 88 with top surfaces of dummy gates 70 and 76. CMP may also remove masks 72 and 78 on dummy gates 70 and 76. Accordingly, top surfaces of dummy gates 70 and 76 may be exposed through ILD 88.

Figure 24A:
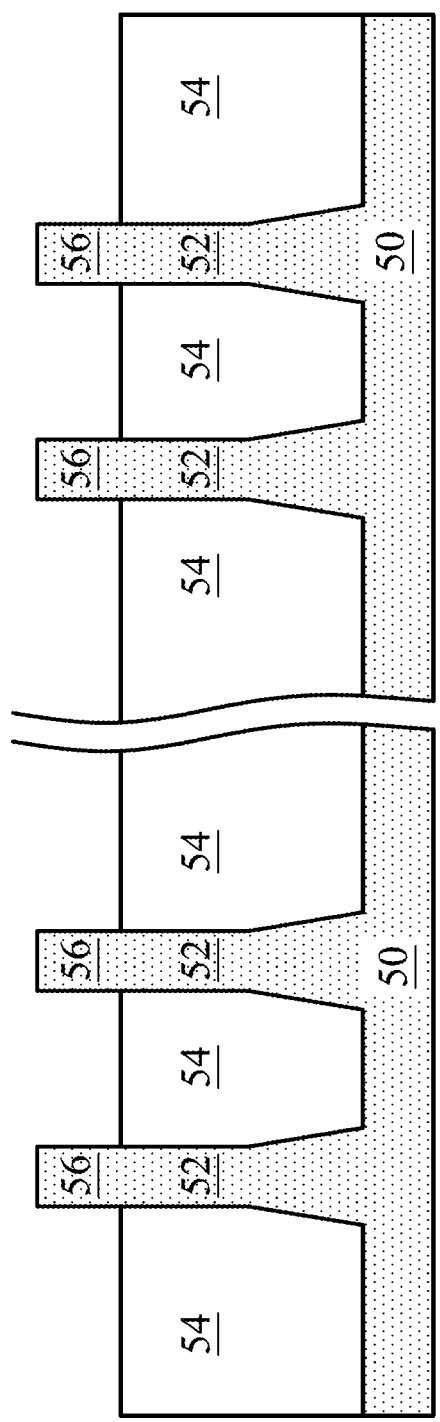
Figure 24C:
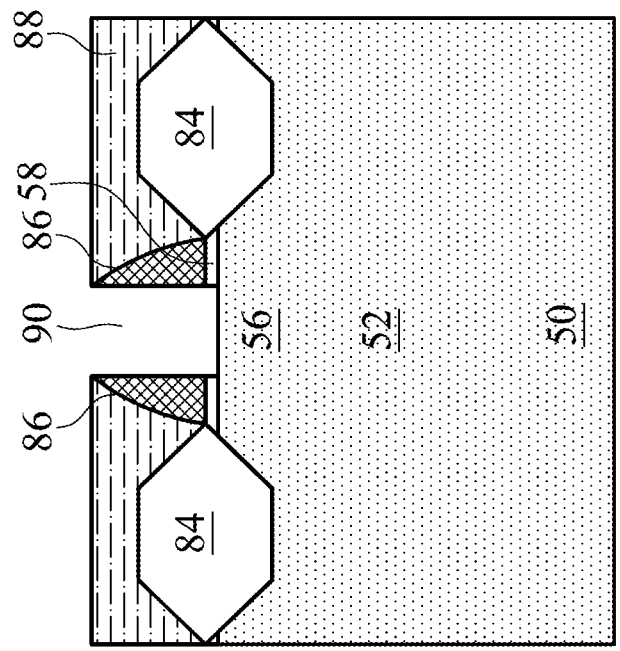
Figure 24B:
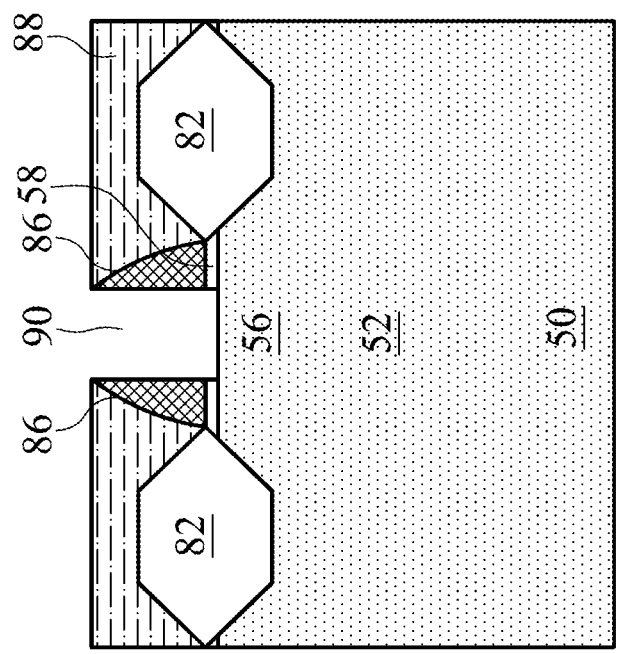

In FIGS. 24a, 24b, and 24c, dummy gates 70 and 76, gate seal spacers 80, and portions of dummy dielectric layer 58 underlying dummy gates 70 and 76 are removed with etching to form recesses 90. Each recess 90 exposes a channel region of a respective fin 56. Each channel region is disposed between neighboring pairs of epitaxial source/drain regions 82 and 84. During removal, dummy dielectric layer 58 may be used as an etch stop layer when dummy gates 70 and 76 are etched. Dummy dielectric layer 58 and gate seal spacers 80 may then be removed after removal of dummy gates 70 and 76.

Figure 25A:
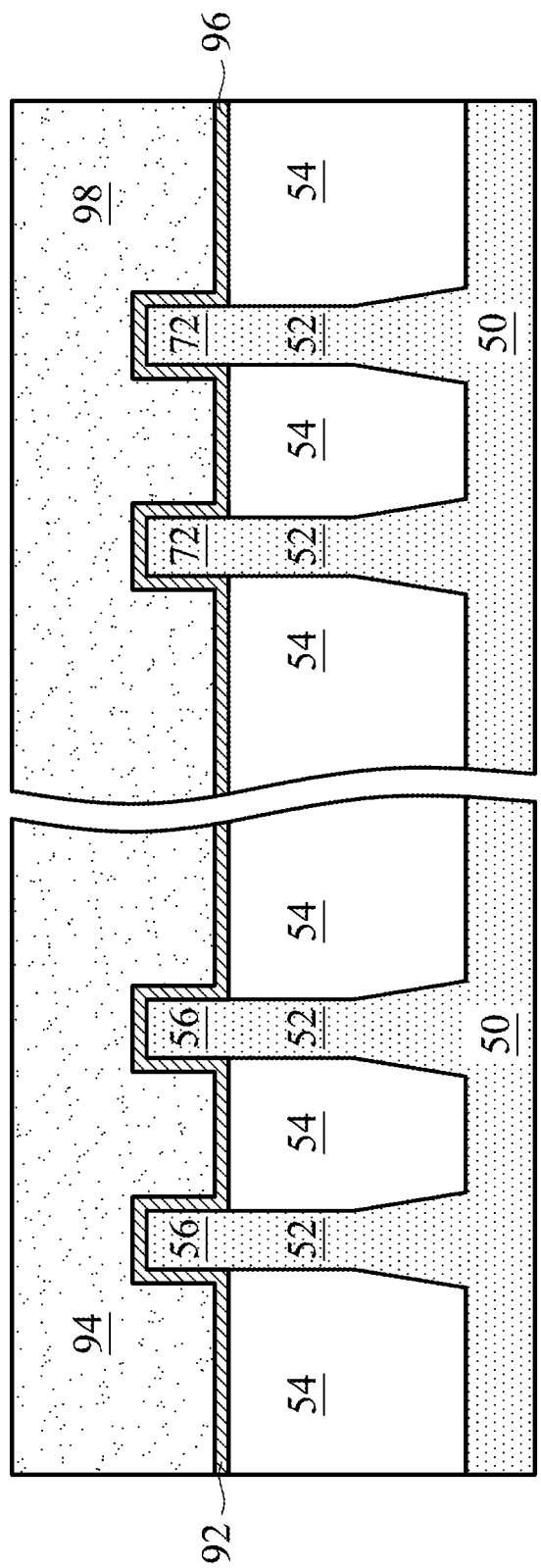
Figure 25C:
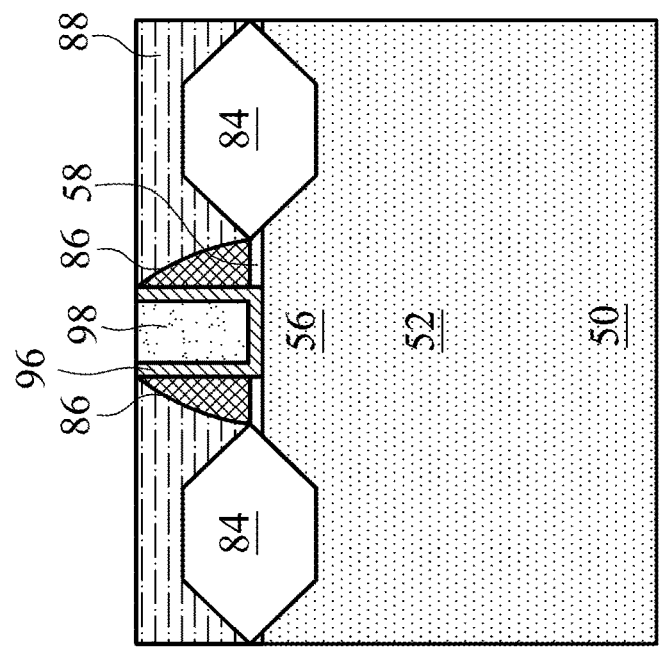
Figure 25B:
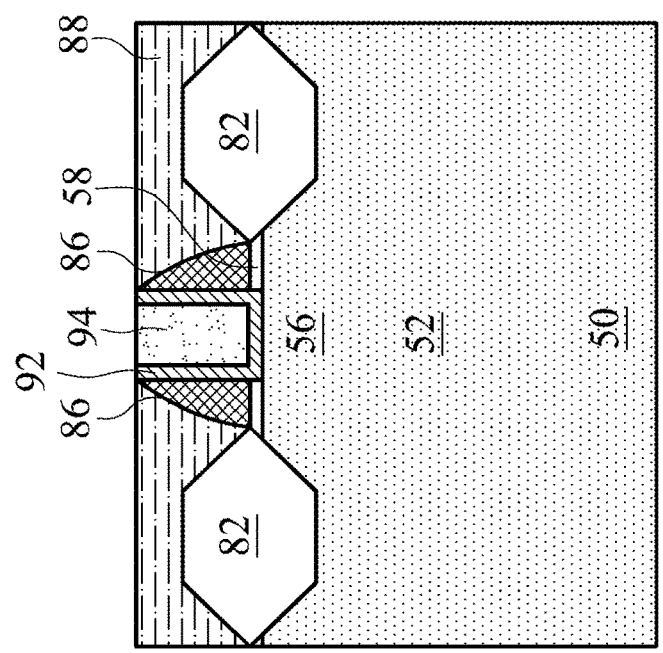

In FIGS. 25a, 25b, and 25c, gate dielectric layers 92 and 96 and gate electrodes 94 and 98 are formed for replacement gates. Gate dielectric layers 92 and 96 are deposited conformally in recesses 90, such as on top surfaces and sidewalls of fins 56 and on sidewalls of gate spacers 86, and on a top surface of ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and/or combinations thereof. Formation methods of gate dielectric layers 92 and 96 may include molecular-beam deposition (MBD), atomic layer deposition (ALD), PECVD, or the like.

Thereafter, gate electrodes 94 and 98 are deposited over gate dielectric layers 92 and 96, respectively, and fill remaining portions of recesses 90. Gate electrodes 94 and 98 may be made of a metal-containing material such as TiN, TaN, TaC, Co, Ru, Al, combinations thereof, or multi-layers thereof. After filling of gate electrodes 94 and 98, a planarization process, such as a CMP, may be performed to remove excess portions of gate dielectric layers 92 and 96, and material of gate electrodes 94 and 98, which excess portions are disposed over the top surface of ILD 88. The resulting remaining portions of material of gate electrodes 94 and 98 and gate dielectric layers 92 and 96 thus form replacement gates of the resulting FinFETs.

The formation of gate dielectric layers 92 and 96 may occur substantially simultaneously such that gate dielectric layers 92 and 96 are made of the same materials, and formation of gate electrodes 94 and 98 may occur substantially simultaneously such that gate electrodes 94 and 98 are made of the same materials. However, in other embodiments, gate dielectric layers 92 and 96 may be formed by discrete processes, such that gate dielectric layers 92 and 96 may be made of different materials, and gate electrodes 94 and 98 may be formed by discrete processes, such that gate electrodes 94 and 98 may be made of different materials. Various masking steps may be used to mask and expose appropriate regions when using discrete processes.

Figure 26A:
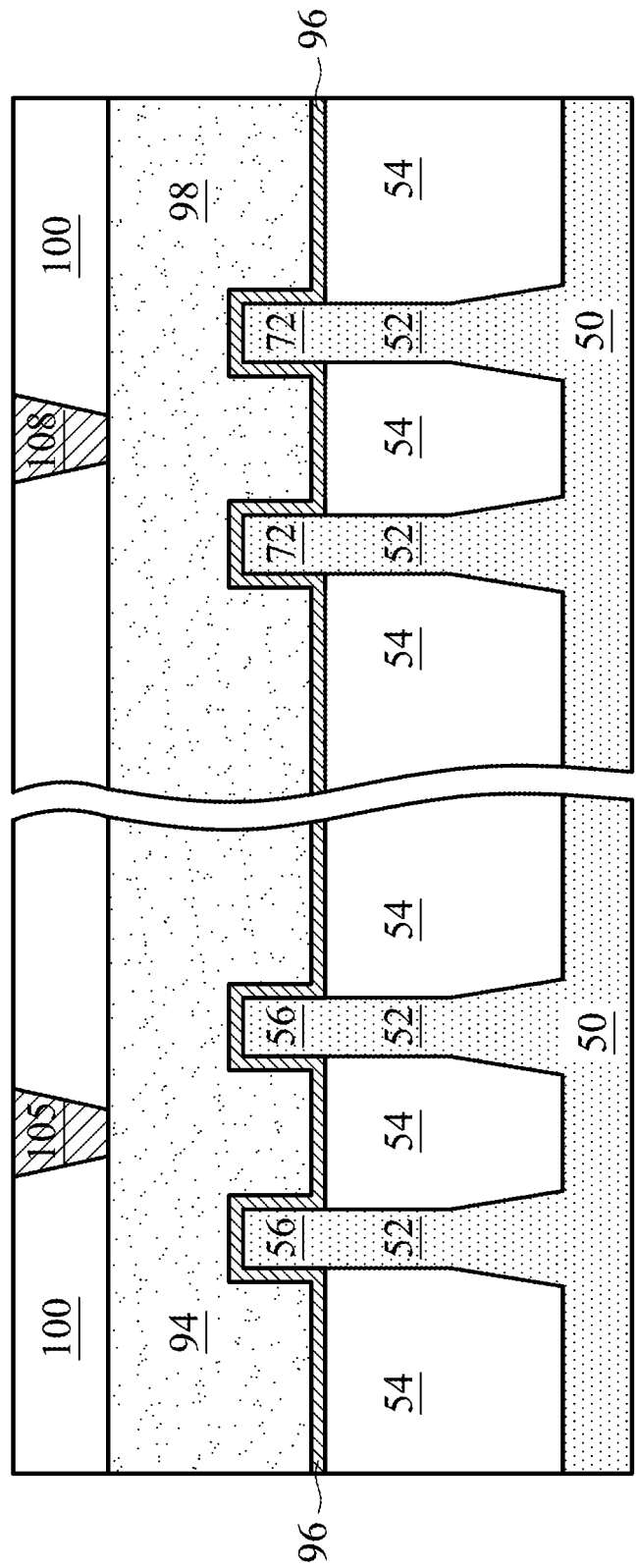
Figure 26C:
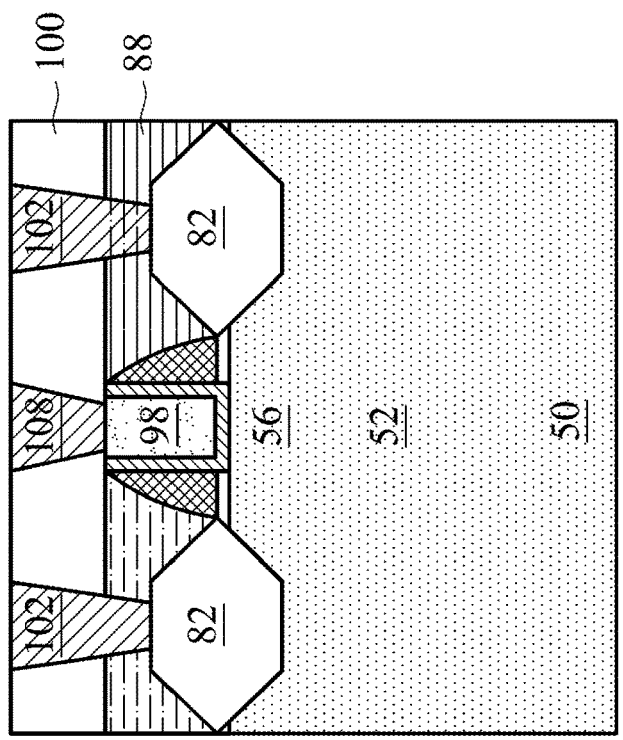
Figure 26B:
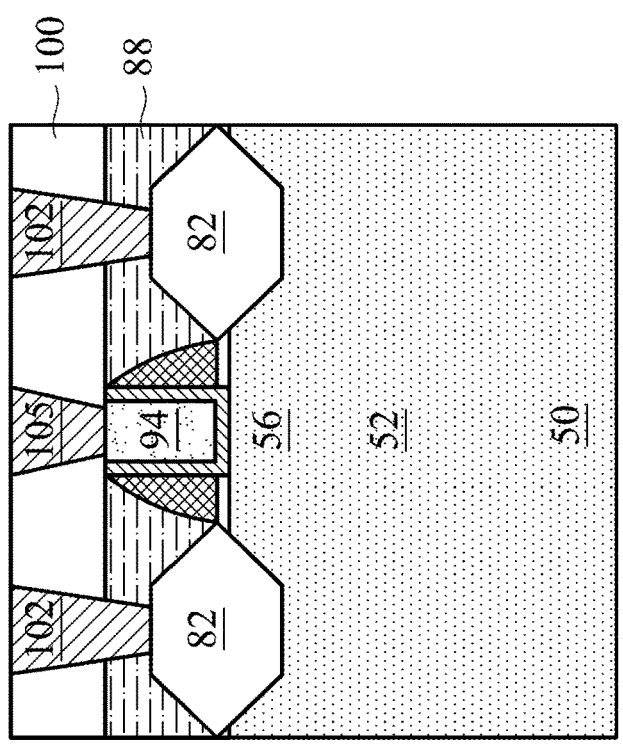

In FIGS. 26a, 26b, and 26c, ILD 100 is deposited over ILD 88. Further illustrated in FIGS. 26a, 26b, and 26c, contacts 102 and 104 are formed through ILD 100 and ILD 88, and contacts 105 and 108 are formed through ILD 100. In an embodiment, ILD 100 comprises a film formed by a flowable CVD method. In some embodiments, ILD 100 is formed of a dielectric material such as PSG, BSG, BPSG, USG, or the like, and may be deposited by any suitable method, such as CVD and PECVD. Openings for contacts 102 and 104 are formed through ILDs 88 and 100. Openings for contacts 105 and 108 are formed through ILD 100. These openings may all be formed substantially simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may comprise copper, a copper alloy, silver, gold, tungsten, aluminum, nickel, or the like. A planarization process, such as a CMP, may be performed to remove excess material from a surface of ILD 100. Remaining liner and conductive material form contacts 102 and 104 in the openings. An anneal process may be performed to form a silicide at the interface between epitaxial source/drain regions 82 and 84 and contacts 102 and 104, respectively. Contacts 102 are physically and electrically coupled to epitaxial source/drain regions 82, contacts 104 are physically and electrically coupled to epitaxial source/drain regions 84, contact 105 is physically and electrically coupled to gate electrode 94, and contact 108 is physically and electrically coupled to gate electrode 98.

Figure 27:
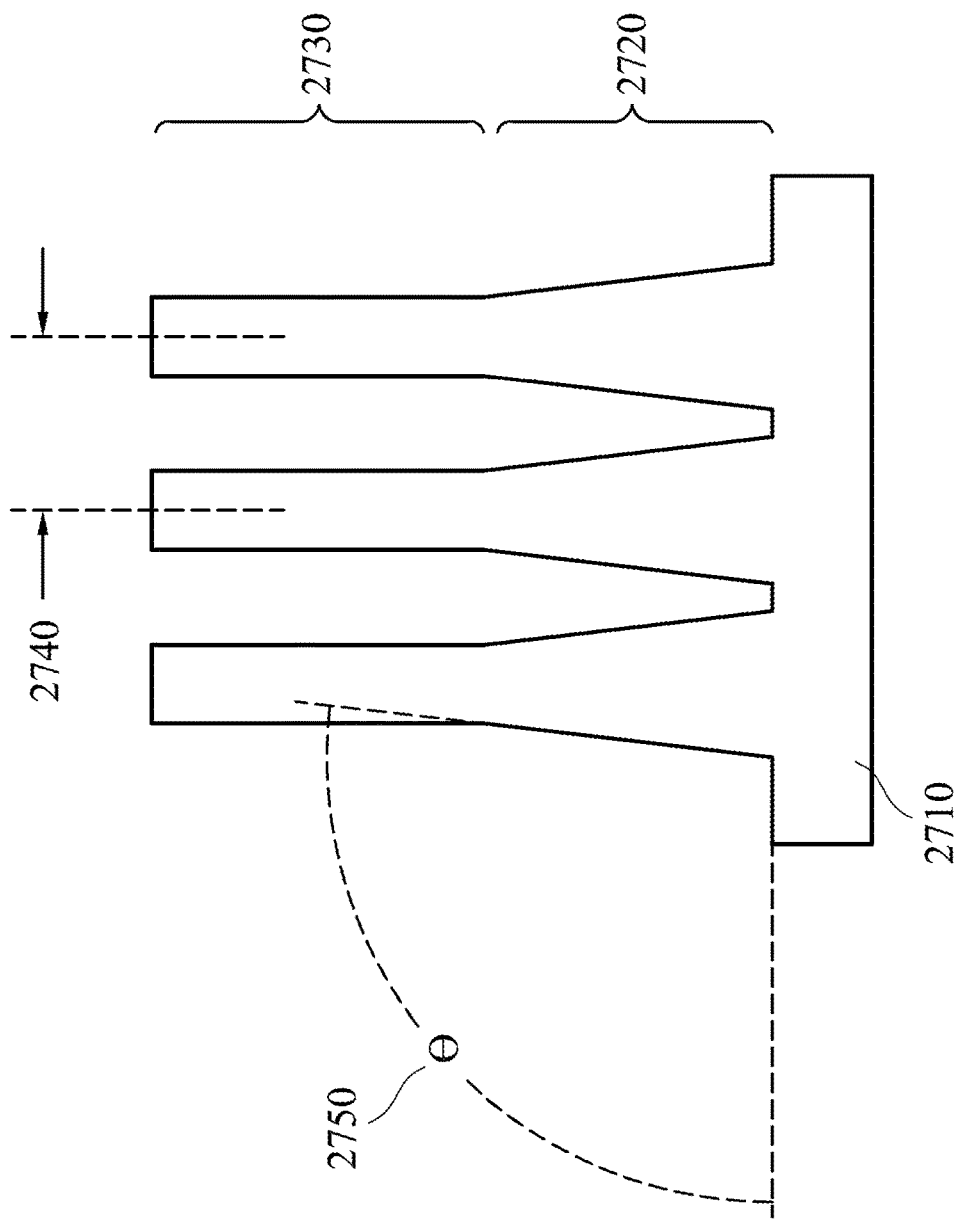
FIG. 27 is a cross-sectional view of a FinFET fin structure produced in accordance with a representative embodiment.

As representatively illustrated in FIG. 27, a radical-component nitride etch may be used to assist definition of pitch 2740 between adjacent upper fin portions 2730. In a representative embodiment, pitch 2740 may be about 1:1. Additionally, representatively disclosed radical-component nitride etching methods may be employed to produce and define an angle 2750 for the profile of a lower fin portion 2720 with respect to a major surface of substrate 2710. In a representative embodiment, profile angle 2750 may be greater than about 90°. In a representative aspect, the height of lower fin portion 2720 and upper fin portion 2730 may total to about 120 nm.

Figure 28:
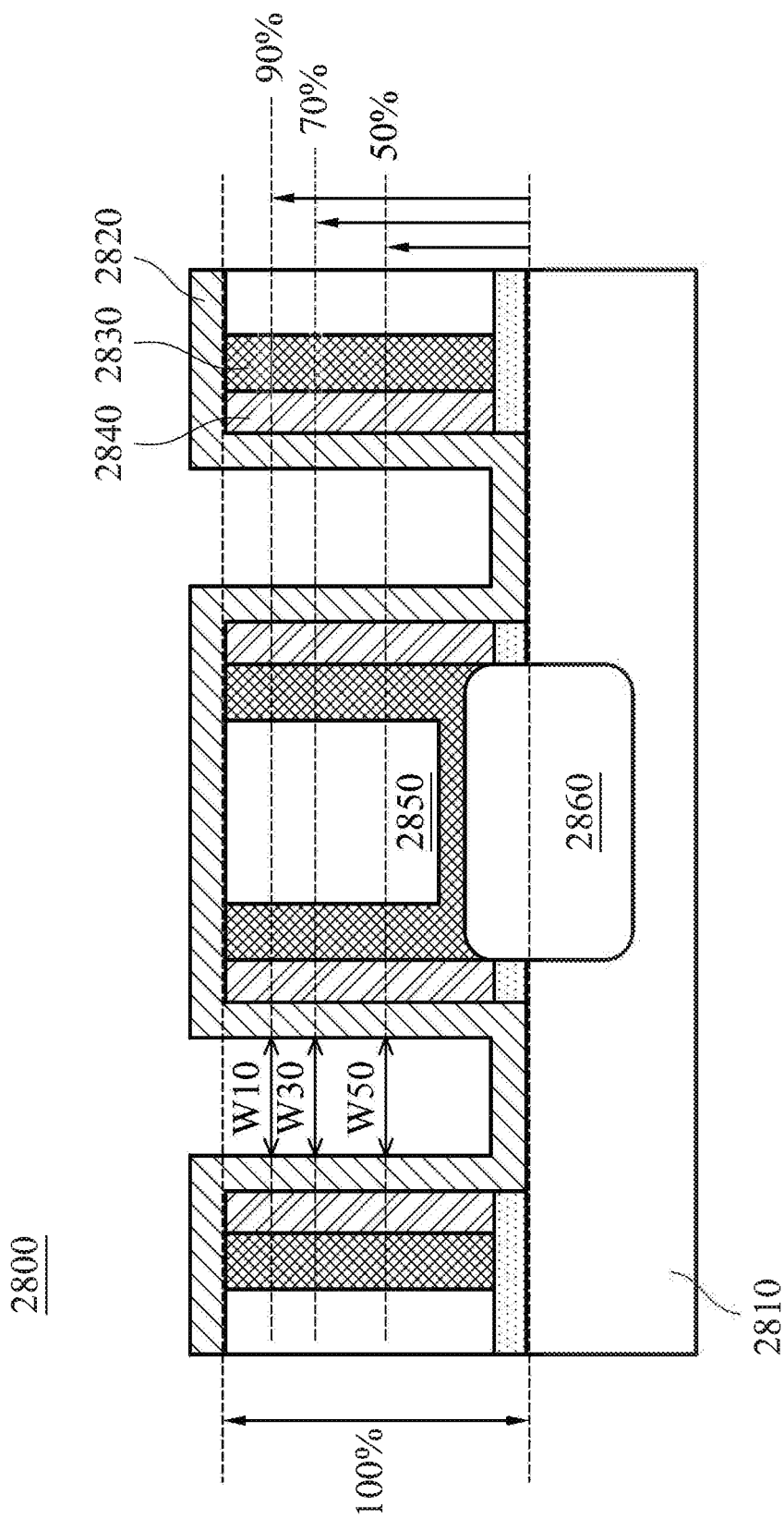
FIG. 28 is another cross-sectional view of a FinFET gate profile structure produced in accordance with a representative embodiment.

FIG. 28 representatively illustrates definition of a metal gate profile for a FinFET device 2800 at an intermediate stage of manufacture, in accordance with a representative embodiment. Doped region 2860 interposes adjacent gate recesses. High-k dielectric layer 2820 lines the gate recesses. Sidewall spacers 2840 are disposed adjacent intrusions of high-k dielectric layer 2820 in the gate recesses and below an upper surface of high-k dielectric layer 2820. Contact etch-stop layer 2830 is disposed adjacent sidewall spacers, and also below the upper surface of high-k dielectric layer 2820. Interlayer dielectric layer 2850 forms interior portions interposed between adjacent gate recess regions. W10 represents the critical dimension of gate width at 90% of the gate height above substrate 2810. W30 represents the critical dimension of gate width at 70% of the gate height above substrate 2810. W50 represents the critical dimension of gate width at 50% of the gate height above substrate 2810. In a representative embodiment, a radical-component nitride etch may be used to assist the definition of critical dimensions such that W10:W30:W50 may be from about 1:0.9:0.9 to about 1:1.1:1.1.

Representative benefits of various disclosed embodiments allow for substantially damage free plasma etching with utilization of radical plasma components and exclusion of ionic plasma components. Other representative benefits allow for controlled definition of fin pitch, fin width, fin profile, and gate profile using radical isotropic etching. Additionally, representative embodiments may find application for etching device structures having aspect ratios greater than about 12. Still other representative benefits include the ability to better control loss of oxide material attendant to selectively etching nitride material. For example, a representative advantage provides a higher dry etching selectivity for silicon nitride (SiN) as compared to silicon oxide ($SiO_x$) (e.g., etching selectivities $SiN:SiO_x$ greater than about 10:1). Yet other representative benefits include avoidance of fin profile damage, void formation, and fin bending and peeling. Still other representative benefits provide for improvement of device function and manufacturing yield.

In an embodiment, a method for selectively etching a nitride-containing material comprises the steps of: receiving/producing a plasma in a first region with a first precursor; separating a radical-containing component from the plasma; flowing the radical-containing component from the first region to a second region; receiving/introducing a second precursor to the second region; and etching a nitride-containing material with a combination of the radical-containing component and the second precursor. The first precursor may be fluorine-containing (e.g., $NF_3$). The second precursor may be hydrogen-containing (e.g., $H_2$). The nitride-containing material may comprise Si (e.g., SiN).

In another embodiment, a method for selectively etching a nitride-containing material comprises the steps of receiving/forming a plasma in an ionization region with a first precursor gas (the plasma comprising a radical component and an ion component) and etching a patterned substrate by: separating the radical component from the ion component; flowing the radical component from the ionization region to a substrate processing region (the substrate processing region different than the ionization region); receiving/introducing a second precursor gas to the substrate processing region; and etching a nitride-containing material on the patterned substrate with a combination of the radical component and the second precursor gas without exposing the nitride-containing material to the ion component of the plasma. Selectivity of the etching for the nitride-containing material may be greater than about 10 times that for an oxide-containing material. The first precursor gas may be fluorine-containing (e.g., $NF_3$). The second precursor gas may be hydrogen-containing ($H_2$). The nitride-containing material may comprise a layer of a fin field-effect transistor (FinFET) device. The nitride-containing material may be SiN.

In yet another embodiment, a method for selectively etching a nitride-containing material comprises the steps of: receiving/disposing a substrate in an etch processing region, the substrate comprising an exposed nitride-containing material and an exposed oxide-containing material; receiving/producing a plasma in a plasma region with a precursor gas; after receiving/producing the plasma, receiving/flowing a radical-containing component of the plasma into the etch processing region while substantially excluding charged ions of the plasma from entry to the etch processing region (the plasma region coupled to the etch processing region); receiving/flowing an unexcited gas into the etch processing region; and etching the exposed nitride-containing material with reaction products of the radical-containing component and the unexcited gas. An etch selectivity of exposed nitride-containing material to exposed oxide-containing material (nitride:oxide) may be greater than about 50:1. The precursor gas may be nitrogen trifluoride, the unexcited gas may be a molecular hydrogen, and the exposed nitride-containing material may comprise silicon (e.g., silicon nitride). The exposed nitride-containing material may comprise a layer of a fin field-effect transistor (FinFET) device.

As used herein, the terms "comprises," "comprising," "includes," "including," "has," "having," or any contextual variant thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Furthermore, unless expressly stated to the contrary, "or" refers to an inclusive or and not an exclusive or. That is, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless the context clearly indicates otherwise. Also, as used in the description herein, the meaning of "in" includes "in" and "on," unless the context clearly indicates otherwise.

Spatially relative terms, such as "up," "down," "under," "below," "lower," "upper," "above," "higher," "adjacent," "interadjacent," "interposed," "between," or the like, may be used herein for ease of description to representatively describe one or more elements or features in relation to other elements or features as representatively illustrated in the Figures. Spatially relative terms are intended to encompass different orientations of devices in use or operation, in addition to orientations illustrated in the Figures. An apparatus or device may be otherwise spatially transformed (e.g., rotated by 90 degrees) and the spatially relative descriptors used herein may likewise be interpreted accordingly.

Examples or illustrations provided herein are not to be regarded in any way as restrictions on, limits to, or express definitions of any term or terms with which they are associated. Instead, these examples or illustrations are to be regarded as being described with respect to a particular embodiment and as merely illustrative. Those skilled in the art will appreciate that any term or terms with which these examples or illustrations are associated will encompass other embodiments that may or may not be given therewith or elsewhere in the specification, and all such embodiments are intended to be included within the scope of that term or terms. Language designating such non-limiting examples and illustrations includes, but is not limited to: "for example," "for instance," "e.g.," "in a representative embodiment," or "in one embodiment." Reference throughout this specification to "one embodiment," "an embodiment," "a representative embodiment," "a particular embodiment," or "a specific embodiment," or contextually similar terminology, means that a particular feature, structure, property, or characteristic described in connection with the embodiment is included in at least one embodiment and may not necessarily be present in all embodiments. Thus, respective appearances of the phrases "in one embodiment," "in an embodiment," or "in a specific embodiment," or similar terminology in various places throughout the specification are not necessarily referring to the same embodiment. Furthermore, particular features, structures, properties, or characteristics of any specific embodiment may be combined in any suitable manner with one or more other embodiments. In representative embodiments, uniform hatching illustrated in the Figures may correspond to a substantially homogenous material. In other representative embodiments, unitary hatching may represent one or more component material layers.

Although methods, steps, operations, or procedures are presented in a specific order, this order may be changed in different embodiments. In some embodiments, to the extent multiple steps are shown as sequential in the specification, Figures, or claims, some combination of such steps in other embodiments may be performed at the same time or in a different order. The sequence of operations described herein may be interrupted, suspended, or otherwise controlled by another process.

Although representative embodiments and their advantages have been described in detail, it should be understood that various changes, substitutions, and alterations may be made herein without departing from the spirit and scope of the disclosure as included by the appended claims. Moreover, the scope of the present disclosure is not intended to be limited to the particular embodiments of any process, product, machine, article of manufacture, assembly, apparatus, composition of matter, means, methods, or steps described in the specification. As one skilled in the art will readily appreciate from the disclosure, various processes, products, machines, articles of manufacture, assemblies, apparatuses, compositions of matter, means, methods, or steps, whether presently existing or later developed, that perform substantially the same function or achieve substantially the same result as the corresponding representative embodiments described herein may be utilized according to the disclosure herein. The appended claims are intended to include within their scope such processes, products, machines, articles of manufacture, assemblies, apparatuses, compositions of matter, means, methods, or steps.

What is claimed is:

1. A method comprising:
receiving a plasma in a first region with a first precursor;
separating a radical-containing component from the plasma;
flowing the radical-containing component from the first region to a second region;
before flowing the radical-containing component to the second region, receiving a second precursor in the second region;
etching a nitride-containing material with a combination of the radical-containing component and the second precursor; and
using the nitride-containing material to form a fin field-effect transistor (FinFET) comprising a gate having a multiplicity of widths of the gate located at a multiplicity of heights of the gate such that a ratio of a first gate width to a second gate width to a third gate width is:
more than 1:1:1 to about 1:1.1:1.1; or
about 1:0.9:0.9 to less than 1:1:1; and
wherein the first gate width is located at 90% of a height of the gate, the second gate width is located at 70% of the height of the gate, and the third gate width is located at 50% of the height of the gate.

2. The method of claim 1, wherein receiving the plasma comprises the first precursor being fluorine-containing.

3. The method of claim 2, wherein receiving the plasma further comprises the first precursor comprising $NF_3$.

4. The method of claim 1, wherein receiving the second precursor comprises the second precursor being hydrogen-containing.

5. The method of claim 4, wherein receiving the second precursor further comprises the second precursor comprising $H_2$.

6. The method of claim 5, wherein receiving the plasma comprises the first precursor comprising $NF_3$.

7. The method of claim 1, wherein etching the nitride-containing material comprises the nitride-containing material comprising Si.

8. The method of claim 7, wherein etching the nitride-containing material further comprises the nitride-containing material comprising SiN.

9. The method of claim 1, the etching the nitride-containing material exposing a surface for a fin field-effect transistor (FinFET) comprising exposing at least one channel region of at least one respective fin of the FinFET device.

10. A method comprising:
receiving a plasma in an ionization region with a first precursor gas, the plasma comprising a radical component and an ion component, the first precursor gas comprising molecular hydrogen;
separating the radical component from the ion component; and
processing a patterned substrate by:
flowing the radical component from the ionization region to a substrate processing region, the substrate processing region different than the ionization region;
receiving a second precursor gas in the substrate processing region, the second precursor gas comprising hydrofluoric acid; and
etching a nitride-containing material on the patterned substrate with a combination of the radical component and the second precursor gas without exposing the nitride-containing material to the ion component, the etching the nitride-containing material comprising the nitride-containing material comprising a layer of a fin field-effect transistor (FinFET) device, the FinFET device comprising a gate having a first gate width at co % of a height of the gate, a second gate width at 70% of the height of the gate, and a third gate width at 50% of the height of the gate, the etching the nitride-containing material defining critical dimensions of the gate such that a ratio of the first gate width to the second gate width to the third gate width is:
about 1:0.9:0.9 to less than 1:1:1; or
more than 1:1:1 to about 1:1.1:1.1.

11. The method of claim 10, wherein the etching the nitride-containing material comprises comprising a selectivity of the etching for the nitride-containing material being greater than about 10 times that for an oxide-containing material.

12. The method of claim 11, wherein the selectivity of the etching for the nitride-containing material being greater than about 50:1.

13. The method of claim 10, wherein etching the nitride-containing material further comprises the nitride-containing material comprising SiN.

14. The method of claim 10, wherein the etching the nitride-containing material defines defining a profile of the gate such that a ratio of the first gate width to the second gate width to the third gate width is about 1:0.9:0.9 to less than 1:1:1.

15. The method of claim 10, wherein the etching the nitride-containing material defines defining a profile of the gate such that a ratio of the first gate width to the second gate width to the third gate width is more than 1:1:1 to about 1:1.1:1.1.

16. The method of claim 10, wherein the receiving the second precursor gas in the substrate processing region being performed before the flowing the radical component from the ionization region to the substrate processing region.

17. A method comprising:
receiving a substrate in an etch processing region, the substrate comprising an exposed nitride-containing material and an exposed oxide-containing material, the exposed nitride-containing material and the exposed oxide-containing material comprising layers of a fin field-effect transistor (FinFET) device, the FinFET device comprising a gate having a first gate width at 90% of a height of the gate, a second gate width at 70% of the height of the gate, and a third gate width at 50% of the height of the gate;
receiving a plasma in a plasma region with a precursor gas;
flowing a radical-containing component of the plasma into the etch processing region while substantially excluding charged ions of the plasma from entry to the etch processing region, wherein the plasma region is coupled to the etch processing region;

receiving an unexcited gas in the etch processing region; and etching the exposed nitride-containing material with reaction products of the radical-containing component and the unexcited gas, the etching the exposed nitride-containing material defining critical dimensions of the gate such that a ratio of the first gate width to the second gate width to the third gate width is:
about 1:0.9:0.9 to less than 1:1:1; or
more than 1:1:1 to about 1:1.1:1.1.

18. The method of claim 17, wherein etching the exposed nitride-containing material comprises an etch selectivity of exposed nitride-containing material to exposed oxide-containing material that is greater than about 50:1.

19. The method of claim 17, wherein:
receiving the plasma comprises the precursor gas comprising nitrogen trifluoride;
receiving the unexcited gas comprises the unexcited gas comprising molecular hydrogen; and
receiving the substrate comprises the exposed nitride-containing material comprising at least one of silicon or silicon nitride.

20. The method of claim 17, wherein etching the exposed nitride-containing material produces a profile angle for a lower fin portion of the FinFET device with respect to a major surface of the substrate, the profile angle being greater than about 90°.

* * * * *

UNITED STATES PATENT AND TRADEMARK OFFICE
CERTIFICATE OF CORRECTION

PATENT NO. : 10,163,650 B2
APPLICATION NO. : 15/355940
DATED : December 25, 2018
INVENTOR(S) : Yi-Wei Chiu Page 1 of 1

It is certified that error appears in the above-identified patent and that said Letters Patent is hereby corrected as shown below:

In the Claims

Column 16, Lines 15-16, Claim 10, delete "a first gate width at co % of a height of the gate" and insert --a first gate width at 90% of a height of the gate--.

Signed and Sealed this
Fourteenth Day of May, 2019

Andrei Iancu
*Director of the United States Patent and Trademark Office*